United States Patent
Aleksov et al.

(10) Patent No.: US 10,403,564 B2
(45) Date of Patent: Sep. 3, 2019

(54) DUAL-DAMASCENE ZERO-MISALIGNMENT-VIA PROCESS FOR SEMICONDUCTOR PACKAGING

(71) Applicant: Intel Corporation, Santa Clara, CA (US)

(72) Inventors: Aleksandar Aleksov, Chandler, AZ (US); Hiroki Tanaka, Chandler, AZ (US); Robert A. May, Chandler, AZ (US); Kristof Darmawikarta, Chandler, AZ (US); Changhua Liu, Chandler, AZ (US); Chung Kwang Tan, Chandler, AZ (US); Srinivas Pietambaram, Gilbert, AZ (US); Sri Ranga Sai Boyapati, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 27 days.

(21) Appl. No.: 15/859,332

(22) Filed: Dec. 30, 2017

(65) Prior Publication Data
US 2019/0206767 A1   Jul. 4, 2019

(51) Int. Cl.
| H01L 21/027 | (2006.01) |
| H01L 21/48 | (2006.01) |
| H01L 23/485 | (2006.01) |
| H01L 23/498 | (2006.01) |
| H01L 23/00 | (2006.01) |

(52) U.S. Cl.
CPC ........ *H01L 23/485* (2013.01); *H01L 21/0275* (2013.01); *H01L 21/481* (2013.01); *H01L 21/4846* (2013.01); *H01L 23/49838* (2013.01); *H01L 24/02* (2013.01); *H01L 2224/0235* (2013.01); *H01L 2224/02313* (2013.01); *H01L 2224/02371* (2013.01); *H01L 2224/02372* (2013.01)

(58) Field of Classification Search
CPC ............... H01L 21/0275; H01L 21/481; H01L 21/4846; H01L 2224/0235; H01L 2224/02371; H01L 23/49838
See application file for complete search history.

(56) References Cited

U.S. PATENT DOCUMENTS 7,829,454 B2 * 11/2010 Suzuki ............. H01L 21/28562
257/E21.584
7,981,756 B2 * 7/2011 Lindert .................. H01L 28/90
257/E21.008

(Continued)

*Primary Examiner* — Mounir S Amer
(74) *Attorney, Agent, or Firm* — Schwabe, Williamson & Wyatt, P.C.

(57) ABSTRACT

Techniques that can assist with fabricating a package layer that includes a plurality of dual-damascene zero-misalignment-vias (dual-damascene ZMVs) and a trace between the dual-damascene ZMVs are described. The disclosed techniques allow for the dual-damascene ZMVs and their corresponding trace to be plated simultaneously in a single step or operation. As such, there is little or no misalignment between the dual-damascene ZMVs, the trace, and the metal pads connected to the ZMVs. In this way, one or more of the embodiments described herein can assist with reducing manufacturing costs, reducing development time of fabricating a package layer, and with increasing the I/O density in a semiconductor package.

36 Claims, 16 Drawing Sheets

(56) References Cited

U.S. PATENT DOCUMENTS

| | | | | |
|---|---|---|---|---|
| 9,620,453 B2* | 4/2017 | Preusse | ............ | H01L 21/76874 |
| 2009/0023098 A1* | 1/2009 | Jain | .................... | H01L 21/0277 |
| | | | | 430/296 |
| 2009/0280649 A1* | 11/2009 | Mayer | ...................... | B23H 5/08 |
| | | | | 438/676 |
| 2010/0311241 A1* | 12/2010 | Kang | ................. | H01L 21/0274 |
| | | | | 438/675 |

* cited by examiner

DUAL-DAMASCENE ZERO-MISALIGNMENT-VIA PROCESS FOR SEMICONDUCTOR PACKAGING

FIELD

Embodiments generally relate to semiconductor packages. More specifically, embodiments relate to techniques of fabricating a semiconductor package having at least one zero-misalignment vertical interconnect access (ZMV) fabricated using a dual-damascene process, which is referred to herein as a dual-damascene ZMV.

BACKGROUND INFORMATION

One of the main drivers for package design rules is the input/output (I/O) density per mm per layer (IO/mm/layer). The I/O density may be limited by the via pad sizes. However, current packaging technologies limit the extent to which the size of the via pads may be reduced.

Traditionally organic substrate manufacturing is performed utilizing semi-additive processing (SAP), with interconnections between layers made by laser drilling processes. Such interconnections include at least one vertical interconnect access (via) that includes a pad. Currently, via pads need to be relatively large due to the laser drilling processes used to create via openings through a dielectric layer above the via pads. Laser drilling is limited by the minimum feature size and the misalignment of the laser when drilling via openings. Some lasers, such as UV lasers, can reduce the via opening more than other types of lasers, but throughput is also greatly decreased.

As explained above, current laser drilling processes may result in creation of an alignment margin that requires a pad beneath a via that is larger than an opening of the via (via opening). This relatively large pad (when compared to the via opening) may limit the I/O density of a device, which may exacerbate difficulties associated with achieving I/O densities that are equal to or greater than 50 IO/mm/layer. One alternative to the laser drilling processes described above is a process of fabricating a zero-misalignment via (ZMV). The process of creating a ZMV (ZMV process) can be used to fabricate vias and pads that can increase I/O densities (when compared to the I/O densities achieved by laser drilling processes). The ZMV process method utilizes a photoresist layer with sensitivity to two different light wavelengths, two different light intensities, two different regions of gray-scale photomask, or a combination thereof. In this way, the photoresist layer can be differentially patterned in conjunction with a dose sensitive resist layer. This allows the vias and traces to be plated in a two-step process without removal of the photoresist layer. Consequently, the ZMV process can assist with avoiding any alignment impact on these layers. In the ZMV process, the line width and line spacing—that is, the pitch—is limited by the resolution of the exposure tool and the resist capability. Another approach of the ZMV process includes use of a dual color—i.e., a dual tone resist that is sensitive to two distinct wavelengths. There are, however, some drawbacks to these approaches. Special resist materials, such as liquid resists, are required for a ZMV process that uses a dual tone resist. In addition, utilizing the previously discussed methods results in a via shape that is not well defined in the direction along the trace and this may have an effect on via's reliability.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1:
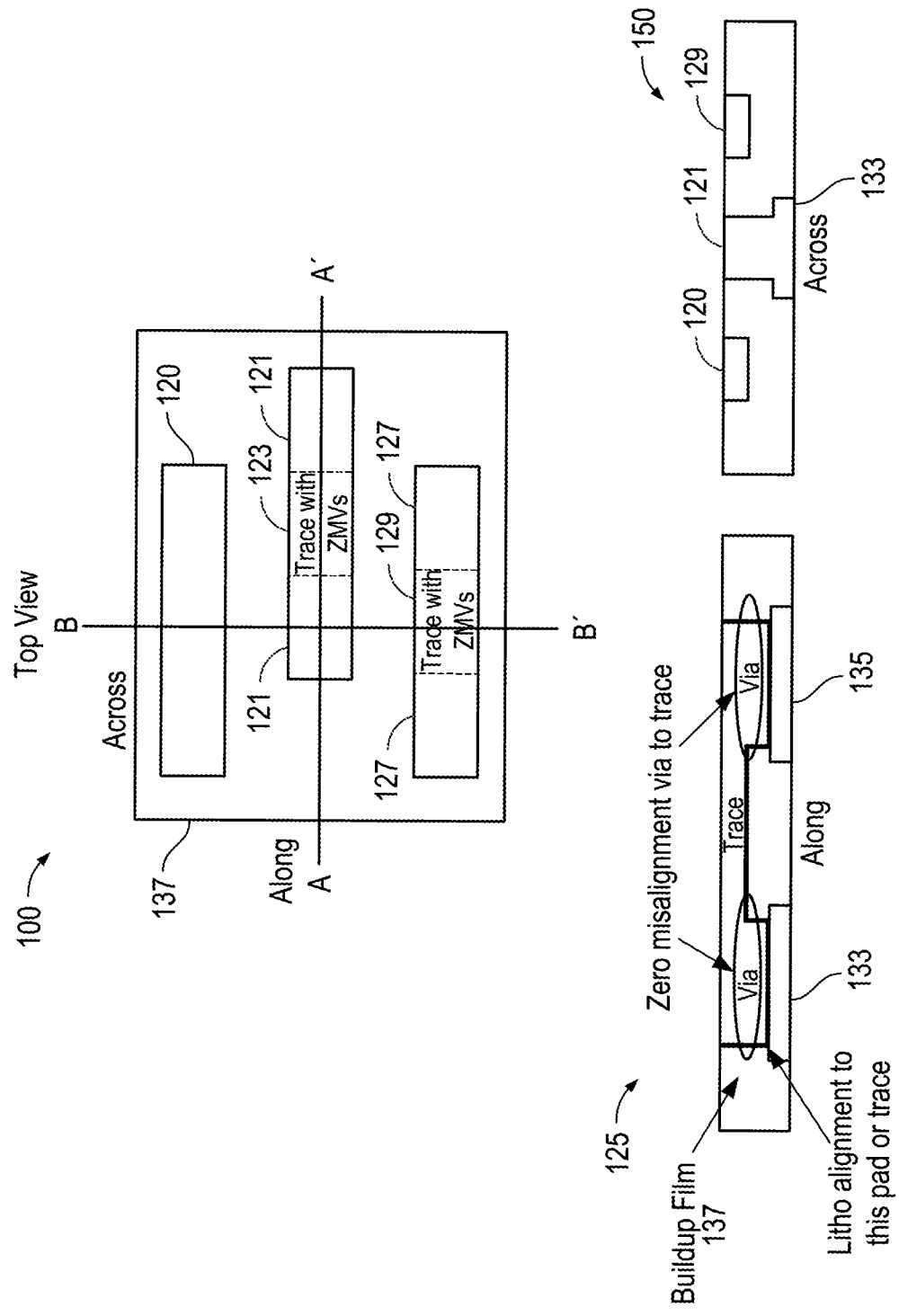
FIG. 1 depicts a plan view and two cross-sectional illustrations of a package layer that includes at least one dual-damascene ZMV according to one or more embodiments.

Embodiments described herein provide techniques that can assist with fabricating a package layer that includes a plurality of dual-damascene zero-misalignment-vias (dual-damascene ZMVs) and a trace between the dual-damascene ZMVs. One advantage of this technique is that the dual-damascene ZMVs and their corresponding trace are plated simultaneously in a single step or operation. As such, there is little or no misalignment between the dual-damascene ZMVs and the trace. In this way, one or more of the embodiments described herein can assist with reducing manufacturing costs, reducing development time of fabricating a package layer, and with increasing the I/O density in a semiconductor package. Furthermore, embodiments of dual-damascene ZMVs described herein advantageously do not have to land on pads in a metal layer, where the metal layer of the pads is below another metal layer harboring the trace between the dual-damascene ZMVs is on the second metal layer. In this way, one or more embodiments described herein can assist with increasing I/O density and/or trace density.

In one embodiment, the process of fabricating a package layer comprising at least one dual-damascene ZMV includes use of two stacked resist layers on a buildup film. The resist materials can be either a liquid resist or a dry film resist. The resists are deposited, e.g., laminated on top of each other. In this way, there is a top resist layer and bottom resist layer below the top resist layer. In one embodiment, one of the resist layers is formed from a resist material that is more or less sensitive to dosing at a given wavelength than the other resist layer. For example, the top resist layer is more sensitive to dosing at a given wavelength than the bottom resist layer. For another example, the top resist layer is less sensitive to dosing at a given wavelength than the bottom resist layer. In one embodiment, a first one of the two resist layers absorbs a wavelength of light that is effectively not absorbed by a second one of the two resist layers and the second one of the two resist layers absorbs a wavelength of light is effectively not absorbed by the first one of the two resist layers. Following an exposure operation, the two resist layers are developed to create a desired pattern. The resulting dual-damascene ZMVs and trace structure between the dual-damascene ZMVs can be transferred into a dielectric material such as a buildup film by dry etching (e.g., inductively coupled plasma reactive ion etching (ICP-RIE), etc.). As a result of the process above, there is little or no misalignment between the dual-damascene ZMVs and the trace between the dual-damascene ZMVs. Furthermore, the dual-damascene ZMVs and the trace between the dual-damascene ZMVs are plated simultaneously (i.e., in one step or operation) and excess copper (Cu) is removed by a polishing process (e.g., Chemical Mechanical Planarization (CMP), etc.).

In another embodiment, the process of fabricating the dual-damascene ZMVs and the trace between the dual-damascene ZMVs includes use of photoimageable dielectric (PID) materials. In this embodiment, two PID layers are deposited (e.g., laminated, etc.) over one another with a top PID layer and a bottom PID layer below the top PID layer. Following an exposure operation, the two PID layers are developed to create a desired pattern. Next, the dual-damascene ZMVs and the trace between the dual-damascene ZMVs are plated simultaneously (i.e., in one step or operation) and excess copper (Cu) is removed by a polishing process (e.g., CMP, etc.).

In yet another embodiment, the process of fabricating the dual-damascene ZMVs and the trace between the dual-damascene ZMVs includes use of PID materials and resist materials. In this embodiment, a resist layer is deposited over a PID layer that is on a buildup film and both layers are processed to create dual-damascene ZMVs and a trace between the dual-damascene ZMVs.

FIG. 1 depicts a plan view 100 and two cross-sectional illustrations 125 and 150 of a package layer that includes dual-damascene ZMVs 121 and 127 according to one or more embodiments. Illustration 125 is a cross-sectional view of the package layer shown in FIG. 1 along the axis A-A' and illustration 150 is a cross-sectional view of the package layer shown in FIG. 1 along the axis B-B'. Additional details about the fabrication of the package layer shown in FIG. 1 are described below in connection with at least FIGS. 3A-3G.

With regard to view 100, the package layer comprises a buildup film 137 (which may also include one or more metal and other layers as is known) having several features on or in the film 137. It is to be appreciated that the buildup film 137 may reside on a substrate core (not shown). Those having skill in the art will appreciate that the substrate core is not shown to avoid obscuring the inventive concepts described herein.

With regard again to the view 100, the features on or in the build film 137 include an image of a feature 120 (e.g., a trace, etc.), a first trace 123 formed between two dual-damascene ZMVs 121, and a second trace 129 formed between two dual-damascene ZMVs 127. As shown, the traces 123, 129 and the dual-damascene ZMVs 121, 127 have reduced sizes on the buildup film 137, which can increase the attainable line density in routing layers of a microelectronic package.

With regard to the view 125, the dual-damascene ZMVs 121 are aligned to the pads 133, 135 and the trace 123 using one or more lithography techniques, as is known in the art. In an embodiment, the pads 133, 135 reside in a first metal layer (e.g., a package interconnect/metal layer, etc.) and the trace 123 resides in a second metal layer that is on the first metal layer. Furthermore, and as shown in the view 125, a top side of the buildup film 137 is co-planar with a top side of the trace 123 and the dual-damascene ZMVs 121.

For one embodiment, the dual-damascene ZMVs 121 and the trace 123 have substantially the same size in one dimension. Using one or more embodiments of the techniques described herein, the dual-damascene ZMVs 121 and the trace 123 are advantageously plated in one step, which can assist with reducing development time and fabrication costs. Plating the dual-damascene ZMVs 121 and the trace 123 in one step can also assist with minimizing or eliminating any misalignment between the dual-damascene ZMVs 121 and the trace 123. Consequently, any misalignment can be very small compared to the size of the dual-damascene ZMVs 121 and the trace 123 ("zero-misalignment"), so that the size of the pads 133, 135 can be reduced to a size that is as at least approximately the size of the dual-damascene ZMVs 121 and the trace 123. Reducing the sizes of the pads 133, 135 advantageously increases the density of the metal lines and other components in or on the buildup film 137. For example, in the context of escape routing for high-bandwidth input/output (TO) connections, reducing the pad sizes 133, 135 increases the maximum realizable density of IO connections (IO/mm).

With regard now to illustration 150, which shows a cross-sectional view of the package layer shown in FIG. 1 along the axis B-B'. Here, the top sides of the feature 120, one of the dual-damascene ZMVs 121, and the trace 129 are co-planar with a top side of the buildup film 137. In some embodiments, and as is shown in FIG. 1, the dual-damascene ZMV 121's through hole may extend onto a top side of the pad 133.

Figure 2:
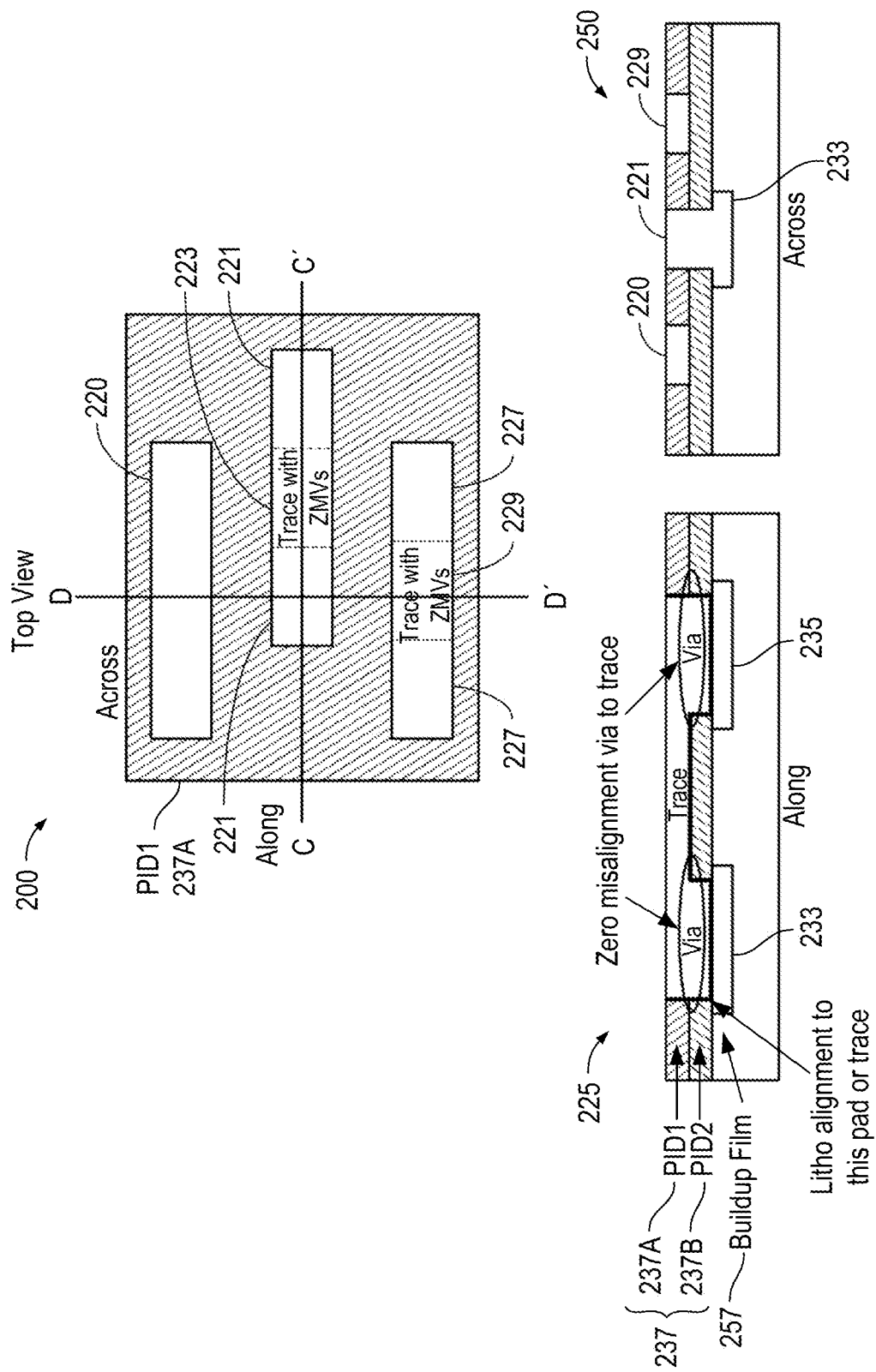
FIG. 2 depicts a plan view and two cross-sectional illustrations of a package layer that includes at least one dual-damascene ZMV according to one or more other embodiments.

FIG. 2 depicts a plan view 200 and two cross-sectional illustrations 225 and 250 of a package layer that includes dual-damascene ZMVs 221 and 227 according to one or more embodiments. Illustration 225 is a cross-sectional view of the package layer shown in FIG. 2 along the axis C-C' and illustration 250 is a cross-sectional view of the package layer shown in FIG. 2 along the axis D-D'. Additional details about the fabrication of the package layer shown in FIG. 2 are described below in connection with at least FIGS. 6A-6E.

As shown in view 200, the package layer comprises a PID layer 237A. The PID layer 237A has several features on a top side of the PID layer 237A. Specifically, the features include an image of a feature 220 (e.g., a trace, etc.), a first trace 223 formed between two dual-damascene ZMVs 221, and a second trace 229 formed between two dual-damascene ZMVs 227. As shown, the traces 223, 229 and the dual-damascene ZMVs 221, 227 have reduced sizes on the PID layer 237A, which can increase the attainable line density in routing layers of a microelectronic package.

With regard to views 225 and 250, the package layer comprises a buildup film 257 (which may also include one or more metal and other layers as is known) having several features on or in the film 257. It is to be appreciated that the buildup film 257 may reside on a substrate core (not shown). Those having skill in the art will appreciate that the substrate core is not shown to avoid obscuring the inventive concepts described herein.

With specific regard to the view 225, the dual-damascene ZMVs 221 are aligned to the pads 233, 235 and the trace 223 using one or more lithography techniques, as is known in the art. Furthermore, and as shown in the view 225, the package layer is comprised of multiple stacked layers on a substrate core (not shown)—(i) a buildup film 257 (which may include metal and other layers); (ii) a PID layer 237B on the buildup film 257; and (iii) a PID layer 237A on the PID layer 237B. Collectively, the PID layers 237A and 237B are referred to as PID layer 237. For one embodiment, each of the dual-damascene ZMVs 221 is formed within the PID layers 237A-B only, while the pads 233, 235 are formed within the buildup film 227 only. Also, and as shown in the view 225, a top side of the PID layer 237A is co-planar with a top side of the trace 223 and top sides of the dual-damascene ZMVs 221. For one embodiment, the PID layers 237A-B have differing characteristics from each other. For example, the PID materials used to form the layers 237A-B can both be formed from positive tone or both be formed from negative tone materials. For another example, the layers 237A-B can either differ in the dose they require to be exposed or the wavelength they require for exposure. The preceding examples may be combined.

For one embodiment, the dual-damascene ZMVs 221 and the trace 223 have substantially the same size as each other in one dimension. Using one or more embodiments of the techniques described herein, the dual-damascene ZMVs 221 and the trace 223 are advantageously plated in one step, which can assist with reducing development time and fabrication costs, as described above in connection with FIG. 1. In one embodiment, the pads 233, 235 are associated with a first metal layer (M-1), while the traces 220, 229 are associated with a second metal layer and a substrate layer (M). The ZMVs are zero misaligned to the second metal layer and the substrate layer (M) without being aligned to the first metal layer (M-1).

Referring now to illustration 250, which shows a cross-sectional view of the package layer shown in FIG. 2 along the axis D-D'. Here, the top sides of the feature 220, one of the dual-damascene ZMVs 221, and the trace 229 are co-planar with a top side of the PID layer 237A. Furthermore, and as is shown, dual-damascene ZMVs 221's through hole extends onto a top side of the pad 233.

FIGS. 3A-3G are cross-sectional side view illustrations of a method of forming a package layer 300 that includes at least one dual-damascene ZMV according to one embodiment. The process described shown in FIGS. 3A-3G can be used to form the package layer described above in connection with FIG. 1.

Figure 3A:
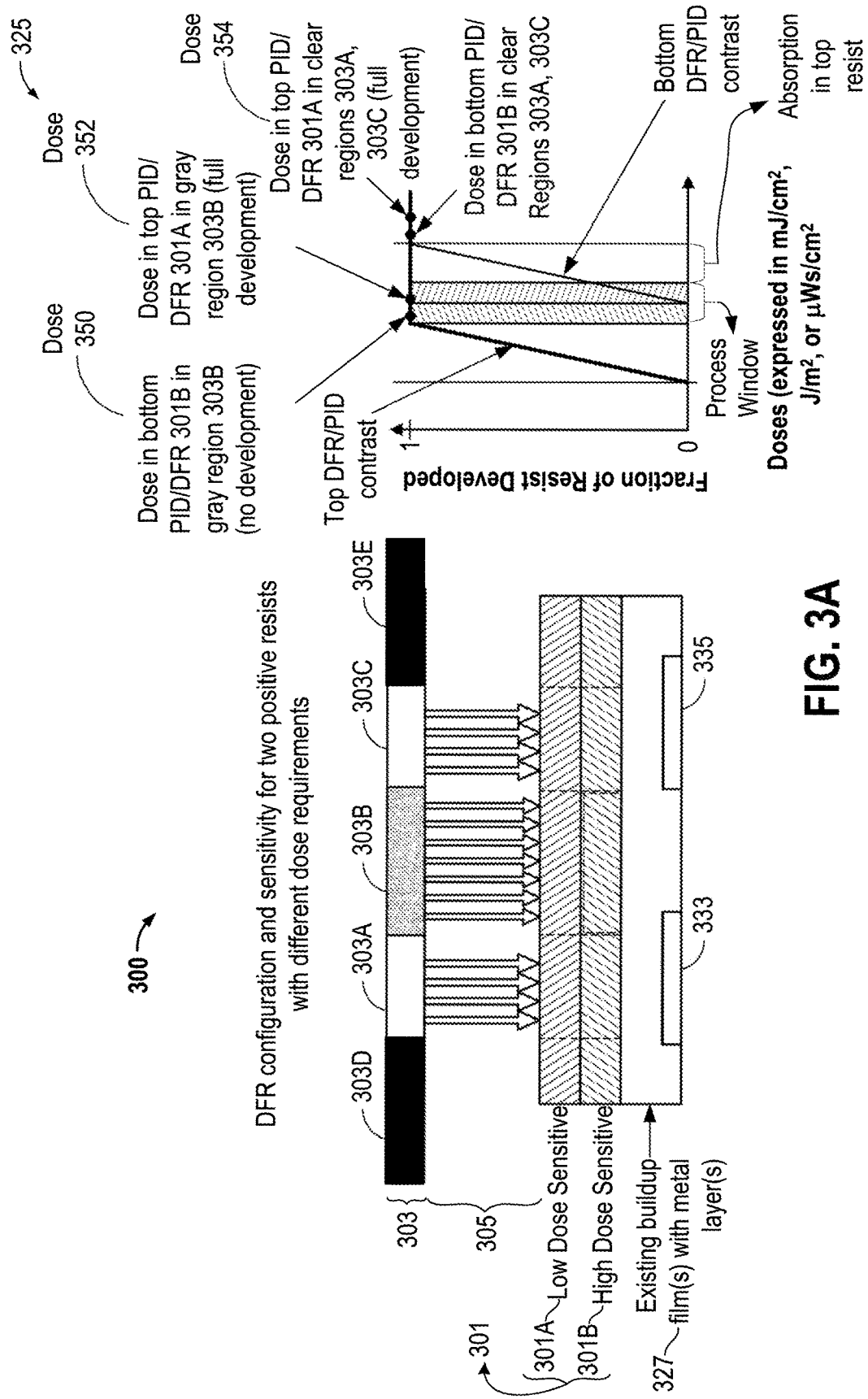
FIGS. 3A-3G are cross-sectional side view illustrations of a method of forming a package layer that includes at least one dual-damascene ZMV according to one embodiment.

Referring now to FIG. 3A, which includes a package layer 300 and a graph 325. Both of these illustrations will be described below.

The method of forming the package layer 300 begins at FIG. 3A, where a buildup film 327 (e.g., one or more build-up layer, metal layers, other layers, etc.) is provided on a substrate core (not shown). Furthermore, pads 333, 335 are formed within the buildup film 327. As shown, top sides of the pads 333, 335 are not co-planar with a top side of the buildup film 327. A resist layer 301 may be deposited on the buildup film 327. Specifically, and in one embodiment, the resist layer 301 comprises two resist layers 301A-B. In one embodiment, the bottom resist layer 301B is deposited on a top side of the buildup film 327 and a top resist layer 301A is deposited on a top side of the bottom resist layer 301B. In one embodiment, the two resist layers 301A-B have different exposure dose requirements from each other. For example, the top resist layer 301A is responsive to a first exposure dose and the bottom resist layer 301B is responsive to a second exposure dose, where the first exposure dose is different from the second exposure dose. Furthermore, the resist layer 301 (i.e., both layers 301A-B) may be formed from positive tone resist materials. Other embodiments, however, are not so limited. For example, the resist layer 301 (i.e., both layers 301A-B) can be formed from negative tone resist materials. FIGS. 4A-4G, which are described below, include a resist layer 401 formed from negative tone resist materials. In one embodiment, the layers 301A-B have a same tone. For example, each of the layers 301A-B is formed from positive-tone materials. For another example, each of the layers 301A-B is formed from negative-tone films. For layers 301A-B formed from positive tone materials, the exposed areas can be removed or washed away during development. For layers 301A-B formed from negative tone materials, the non-exposed areas are removed or washed away during development.

Referring again to FIG. 3A, which also includes a lithographic photomask 303. The photomask 303 may be used, via exposure to ultraviolet (UV) light 305, to form latent images in the resist layer 301. The photomask 303 may be a gray-scale photomask comprised of multiple regions. In one embodiment, the photomask 303 includes one or more regions 303A-E, where the regions comprise: (i) transparent regions 303A, 303C; (ii) opaque regions 303D, 303E; and (iii) a semi-opaque region 303B. The photomask 303 can, for example, be a gray-scale photomask based on one or more halftone gray-scale masks formed using thin copper (Cu), high-energy beam-sensitive (HEBS) glass, gray-scale photomask comprising metal-metal oxide system manufactured by laser direct-writing method, or any combination thereof.

In one embodiment, a dose of the UV light 305 that passes through the regions 303A, 303C of the photomask 303 treats portions of the resist layer 301 below the regions 303A and 303C such that those portions are fully developed. As used herein, a portion of the resist layer 301 is fully developed when the entirety of the portion (as measured by the portion's z-height) is developed. In one embodiment, a dose of the UV light 305 that passes through the region 303B treats portions of the resist layer 301 below the region 303B such that those portions are partially developed. As used herein, a portion of the resist layer 301 is partially developed when less than the entirety of the portion (as measured by the portion's z-height) is developed.

As used herein, a "dose of UV light," a "UV light dose," and their variations refer to a product of a UV light's intensity and a time that a portion of a resist layer is exposed to the UV light. UV light dose is typically expressed in $mJ/cm^2$, $J/m^2$, or $\mu Ws/cm^2$. In one embodiment, and as shown in FIG. 3A, the photomask 303 allows for an intensity of the UV light 305 to be binary modulated (e.g., all of the UV light 305 passes through the photomask 303, etc.). For example, regions 303A and 303C of the photomask 303 allow all of the UV light 305 to pass through the photomask 303 and treat portions of the resist layer 301.

Referring briefly to graph 325 of FIG. 3A, which includes an abscissa (x-axis) and an ordinate (y-axis). The x-axis represents an amount of development of portions the resist layer 301 in fractions of the resist layer 301's z-height, where the z-height is normalized to a range of values (e.g., a value of one (1) to a value of zero (0), etc.), and where the resist layer 301 is formed from positive tone materials. The y-axis represents a range of UV light doses of the UV light 305 applied to portions of the resist layer 301. These doses can be represented as values expressed in $mJ/cm^2$, $J/m^2$, or μWs/cm². As shown, four doses—dose 350; dose 352; dose 354; and dose 356—are represented in the graph 325. Dose 350 represents the lowest dose of the UV light 305 that passes through the region 303B of the photomask 303 and may be applied to the resist layer 301 which would not result in development of a portion of the higher dose sensitive resist layer 301B under the region 303B of the photomask 303. Dose 352 represents the lowest dose of the UV light 305 that passes through the region 303B and may be applied to the resist layer 301 which would result in development of a portion of the lower dose sensitive resist layer 301A under the region 303B. Dose 354 represents the lowest dose of the UV light 305 that passes through the regions 303A, 303C and may be applied to the resist layer 301 which would result in development of portions of the higher dose sensitive resist layer 301B under the regions 303A, 303C. Dose 356 represents the lowest dose of the UV light 305 that passes through the regions 303A, 303C and may be applied to the resist layer 301 which would result in development of portions of the lower dose sensitive resist layer 301A under the regions 303A, 303C. In one embodiment, and as shown in the graph 325, application of a dose that: (i) passes through the region 303B; (ii) is at least equal to dose 350; and (iii) at most less than dose 352 will result in partial development of the portion of the resist layer 301 that is below the region 303B. In one embodiment, and as shown in the graph 325, application of a dose that: (i) passes through the regions 303A, 303C; (ii) is at least equal to dose 354; and (iii) at most less than dose 356 will result in full development of the portions of the resist layer 301 that are below the regions 303A, 303C.

Figure 3B:
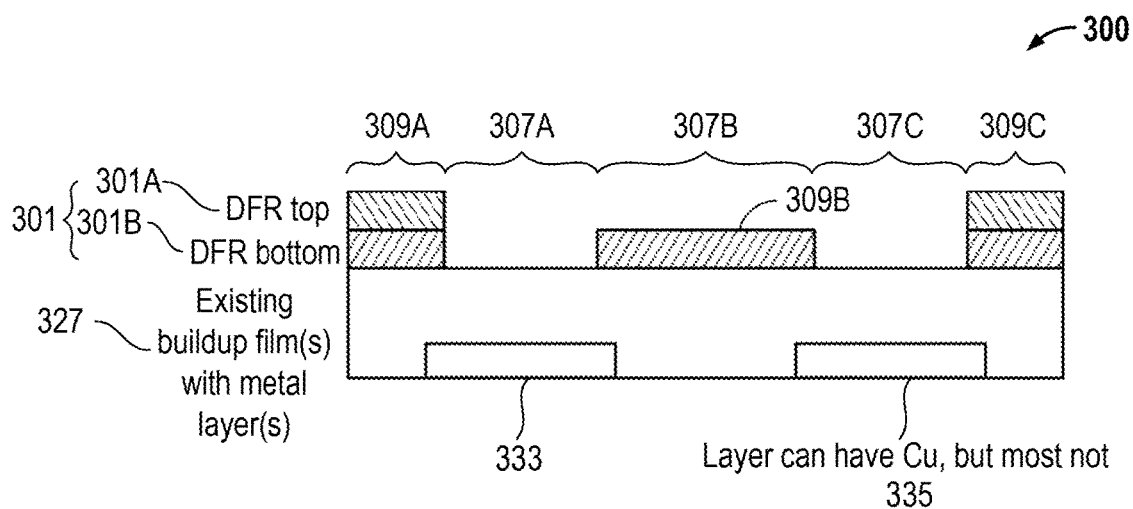

Referring now to FIG. 3B, the resist layer 301 may be rinsed with an appropriate solvent. Furthermore, exposed areas of the resist layer 301 may be processed to form cavities 307A-C by wet or dry etching, lift-off, doping, or any other suitable process. In one embodiment, dry etching is used to form the cavities 307A-C. Examples of dry etching include, but are not limited to, an ICP-RIE process and an RIE process. As shown, the process of forming cavities 307A-307C can be performed in single operation that includes processing exposed areas of the resist layer 301 without processing the unexposed areas of the resist layer 301. Following the processing of the exposed areas of the resist layer 301, the package layer 300 includes pillars 309A-C and cavities 307A-C. The cavities 307A, 307C uncover a top surface of the buildup film 327 (e.g., one or more buildup films with metal layer(s) having pads 333 and 335, etc.). Also, the cavity 307B uncovers a top surface of a pillar 309B formed from the resist layer 301B. The pillars 309A, 309C are formed from the resist layers 301A-B.

Figure 3C:
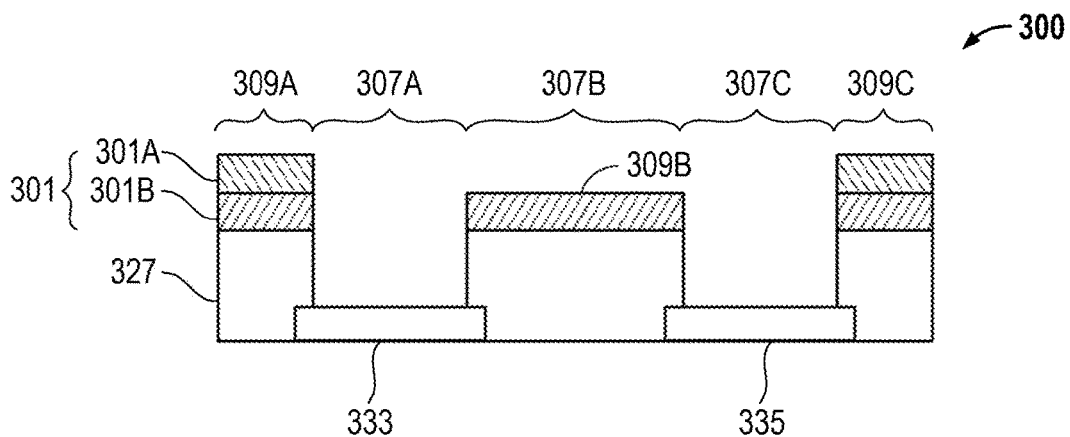

With regard now to FIG. 3C, the cavities 307A and 307C may be further processed to remove additional portions of the buildup film 327. Any suitable technique, such as wet or dry etching, may be used for removal of these additional portions of the buildup film 327. In one embodiment, the cavities 307A and 307C are further processed to uncover top surfaces of the pads 333 and 335, respectively.

Figure 3D:
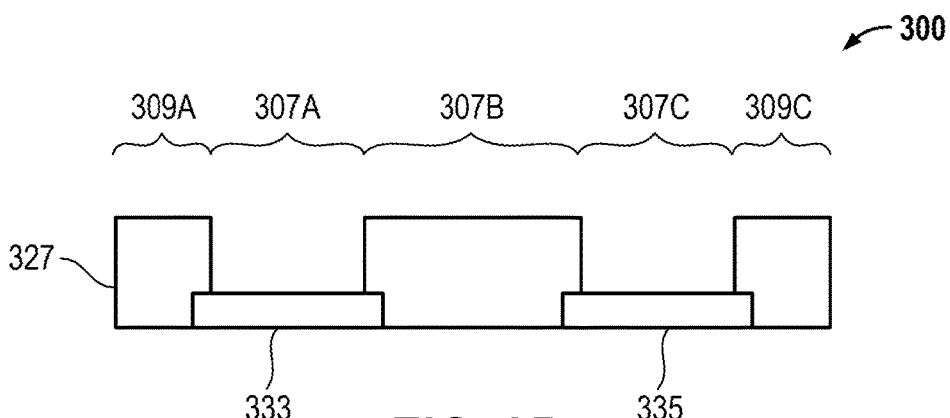

With regard now to FIG. 3D, the resist layer 301 may be processed by removing the top and bottom resist layers 301A-B to uncover top surfaces of the buildup film 327, the pad 333, and the pad 335. Any suitable technique may be used for removal of the resist layer 301. Examples include, but are not limited to, any known technique of photoresist stripping (e.g., organic stripping, inorganic stripping, dry stripping, etc.).

Figure 3E:
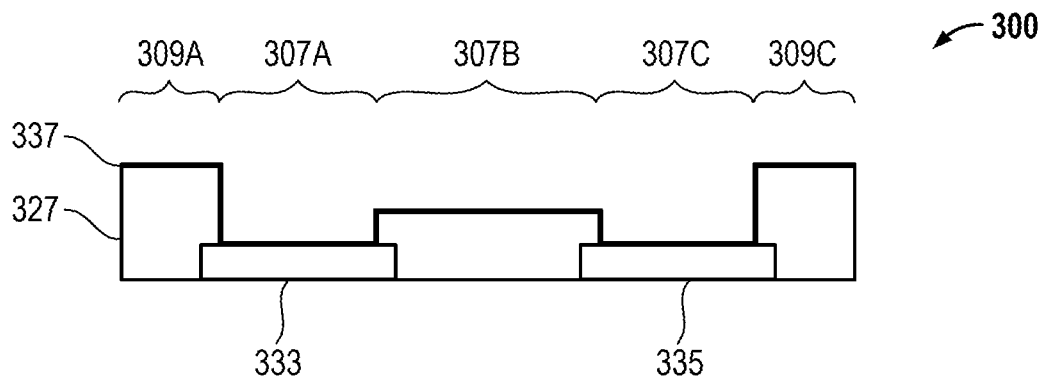
Figure 3F:
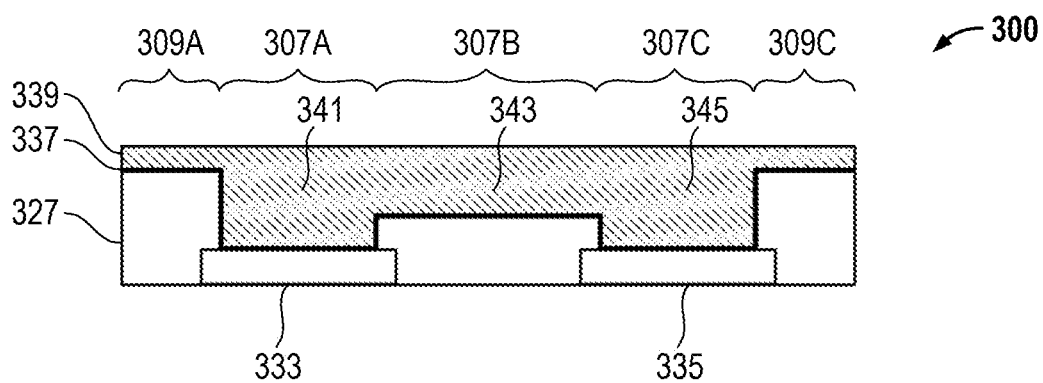
Figure 3G:
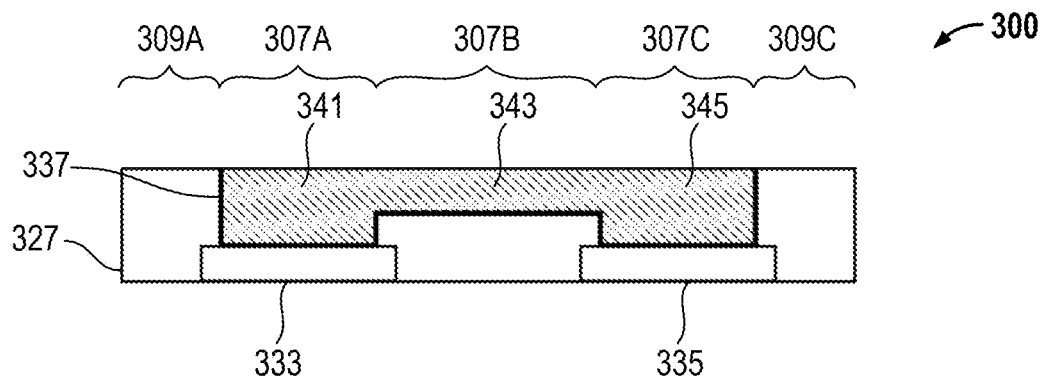

Referring now to FIGS. 3E-3G, metallization of two dual-damascene ZMVs and a trace between the ZMVs is illustrated. With specific regard to FIG. 3E, a seed layer 337 is deposited over the uncovered top surfaces of the buildup film 327 and the pads 333, 335. The seed layer 337 can be deposited via an electroless plating technique, a sputtering technique, a combination thereof, or any suitable technique of depositing seed layers. The seed layer 337 can be formed from copper (Cu), titanium (Ti), or any suitable metal or alloys used for forming seed layers.

Moving on to FIG. 3F, a metal (e.g., Cu, etc.) 339 may be plated over the deposited seed layer 337 to cover the pillars 309A-C and fill up the cavities 307A-C. Next, and as shown in FIG. 3G, the excess metal 339 may be removed any suitable removal technique. For one embodiment, the plating of the metal 339 and the subsequent removal of the excess metal 339 results in simultaneous fabrication of a dual-damascene ZMV 341, a dual-damascene ZMV 345, and a trace 343 between the dual-damascene ZMVs 341, 345. The fabrication, in one step, of the dual-damascene ZMVs 341, 345 and the trace 343 can assist with reducing manufacturing costs and development time. Furthermore, as a result of the process above, there is minimal or no misalignment between the dual-damascene ZMV 341, the dual-damascene ZMV 345, and the trace 343. In some embodiments, the pads 333, 335 may, for instance, connect to a board or a die (not shown). In these embodiments, the dual-damascene ZMVs 341, 345 do not have to land on pads in a metal layer harboring trace 343. In this way, the dual-damascene ZMVs 341, 345 can increase I/O density and/or better trace density. Any suitable techniques of plating the metal 339 may be used. One example of a technique for removing the excess metal 339 is a chemical-mechanical-polishing (CMP) technique.

FIGS. 4A-4G are cross-sectional side view illustrations of a method of forming a package layer 400 that includes at least one dual-damascene ZMV according to one embodiment. The process described shown in FIGS. 4A-4G can be used to form the package layer described above in connection with FIG. 1.

Figure 4A:
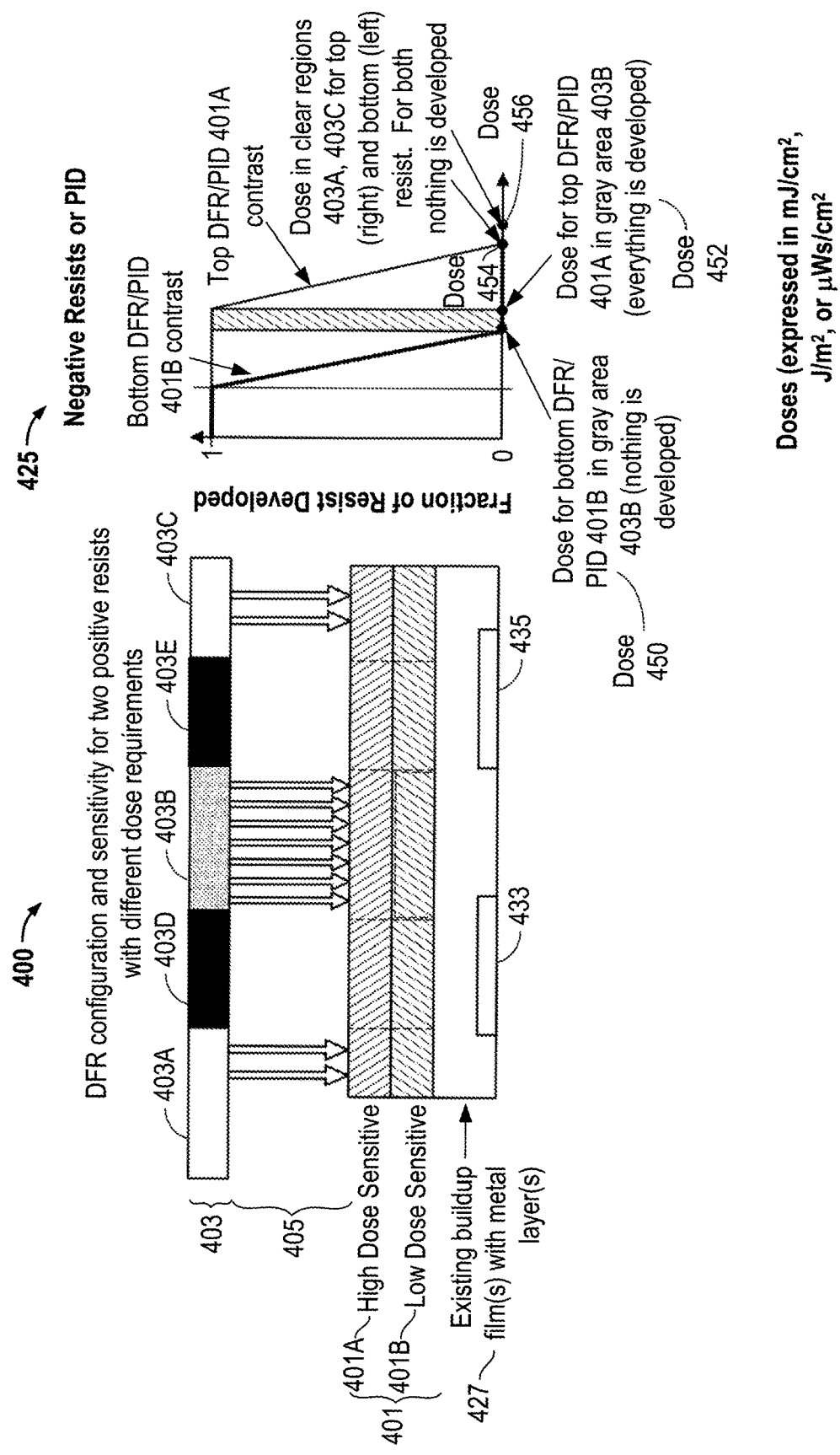
FIGS. 4A-4G are cross-sectional side view illustrations of a method of forming a package layer that includes at least one dual-damascene ZMV according to another embodiment.

Referring now to FIG. 4A, which includes a package layer 400 and a graph 425. Both of these illustrations will be described below.

The method of forming the package layer 400 begins at FIG. 4A, where a buildup film 427 (which may include one or more build-up layer, metal layers, other layers, etc.) is provided on a substrate core (not shown). Furthermore, the pads 433, 435 are formed within the buildup film 427. As shown, top sides of the pads 433, 435 are not co-planar with a top side of the buildup film 427. Furthermore, a resist layer 401 is deposited on the buildup film 427. Specifically, and in one embodiment, the resist layer 401 comprises two resist layers 401A-B. In one embodiment, the bottom resist layer 401B is deposited on a top side of the buildup film 427 and a top resist layer 401A is deposited on a top side of the bottom resist layer 401B. In one embodiment, the two resist layers 401A-B have different exposure dose requirements from each other. For example, the top resist layer 301A is a first exposure dose and the bottom resist layer 301B is responsive to a second exposure dose that differs from the first exposure dose. Furthermore, the resist layer 401 (i.e., both layers 401A-B) may be formed from negative resist materials. Other embodiments, however, are not so limited. For example, the resist layer 301, which is described above in connection with FIGS. 3A-3G, can be formed from positive resist materials.

Referring again to FIG. 4A, which also includes a lithographic photomask 403. The photomask 403 may be used, via exposure to ultraviolet (UV) light 405, to form latent images in the resist layer 401. In one embodiment, the photomask 403 includes one or more gray-scale regions 403A-E, where the regions comprise: (i) transparent gray-scale regions 403A, 403C; (ii) opaque gray-scale regions 403D, 403E; and (iii) a semi-opaque gray-scale region 403B. A gray-scale photomask comprising multiple regions is described above.

In one embodiment, a dose of the UV light 405 that passes through the regions 403A, 403C treats portions of the resist layer 401 below the regions 403A and 403C such that those portions are not fully or partially developed. In one embodiment, a dose of the UV light 405 that passes through the region 403B treats portions of the resist layer 401 below the region 403B such that those portions are partially developed.

In one embodiment, and as shown in FIG. 4A, the photomask 403 allows for an intensity of the UV light 405 to be binary modulated (e.g., all of the UV light 405 passes through the photomask 403, etc.). For example, regions 403A and 403C allow all of the UV light 405 to pass through the photomask 403 and treat portions of the resist layer 301.

Referring briefly to graph 425 of FIG. 4A, which includes an abscissa (x-axis) and an ordinate (y-axis). The x-axis represents an amount of development of portions the resist layer 401 in fractions of the resist layer 401's z-height, where the z-height is normalized to a range of values (e.g., a value of one (1) to a value of zero (0), etc.), and where the resist layer 401 is formed from negative resist materials. The y-axis represents a range of UV light doses of the UV light 405 applied to portions of the resist layer 401. These doses can be represented as values expressed in $mJ/cm^2$, $J/m^2$, or $\mu Ws/cm^2$. As shown, four doses—dose 450; dose 452; dose 454; and dose 456—are represented in the graph 425. Dose 450 represents the lowest dose of the UV light 405 that passes through the region 403B and may be applied to the resist layer 401 which would not result in development of a portion of the lower dose sensitive resist layer 401B under the region 403B. Dose 452 represents the lowest dose of the UV light 405 that passes through the region 403B and may be applied to the resist layer 401 which would result in development of a portion of the higher dose sensitive resist layer 401A under the region 403B. Dose 454 represents the lowest dose of the UV light 405 that passes through the regions 403A, 403C and may be applied to the resist layer 401 which would not result in development of portions of the higher dose sensitive resist layer 401A under the regions 403A, 403C. Dose 456 represents the lowest dose of the UV light 405 that passes through the regions 403A, 403C and may be applied to the resist layer 401 which would not result in development of portions of the lower dose sensitive resist layer 401B under the regions 403A, 403C. In one embodiment, and as shown in the graph 425, application of a dose that is at least equal to dose 450 and at most less than dose 452 will result in partial development of the portion of the resist layer 401 that is below the region 403B. In one embodiment, and as shown in the graph 425, application of a dose that is at least equal to dose 454 and at most less than dose 456 will not result in full or partial development of the portions of the resist layer 401 that are below the regions 403A, 403C.

Figure 4B:
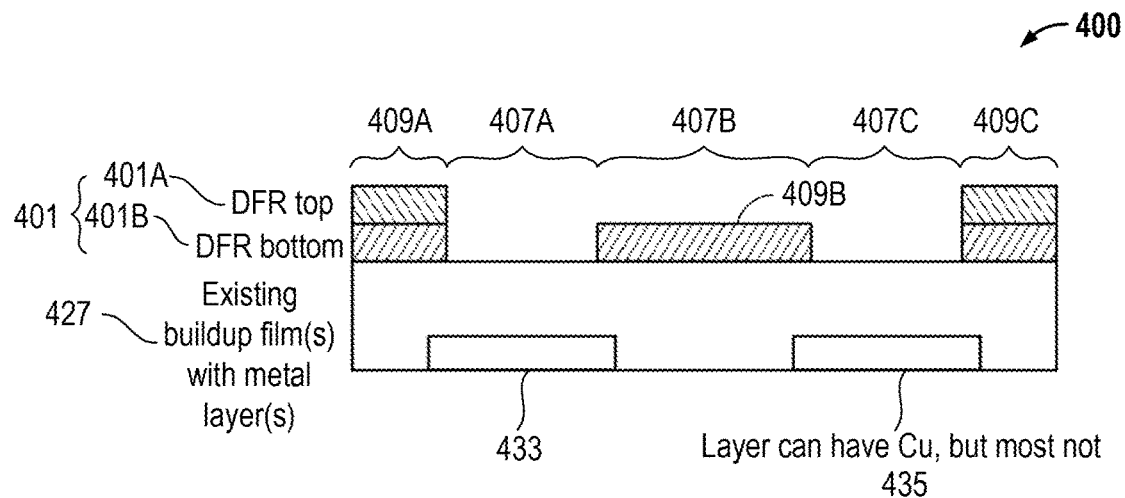

Referring now to FIG. 4B, the resist layer 401 is rinsed with an appropriate solvent. Furthermore, unexposed areas of the resist layer 401 may be processed to form cavities 407A-C by wet or dry etching, lift-off, doping, or any other suitable process. In one embodiment, dry etching is used to form the cavities 407A-C. Examples of dry etching include, but are not limited to, an ICP-RIE process and an RIE process. As shown, the process of forming cavities 407A-407C can be performed in single operation that includes processing unexposed areas of the resist layer 401 without processing the exposed areas of the resist layer 401. Following the processing of the unexposed areas of the resist layer 401, the package layer 400 includes pillars 409A-C and cavities 407A-C. The cavities 407A, 407C uncover a top surface of the buildup film 427 (e.g., one or more buildup film with metal layer(s) having pads 433 and 435, etc.). Also, the cavity 407B uncovers a top surface of a pillar 409B, where the pillar 409B is formed from the resist layer 401B. The pillars 409A, 409C are formed from the resist layers 401A-B.

Figure 4C:
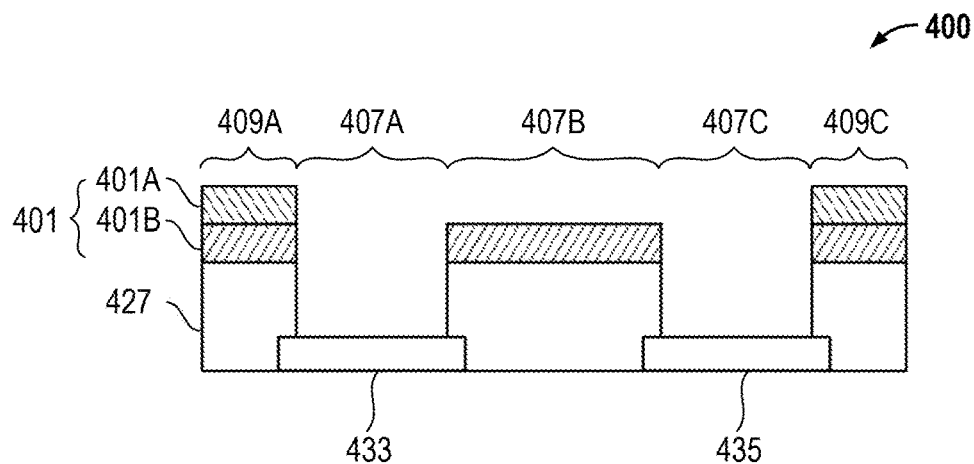

With regard now to FIG. 4C, the cavities 407A and 407C may be further processed to remove additional portions of the buildup film 427. Any suitable technique, such as wet or dry etching, may be used for removal of these additional portions of the buildup film 427. In one embodiment, the cavities 407A and 407C are further processed to uncover top surfaces of the pads 433 and 435, respectively.

Figure 4D:
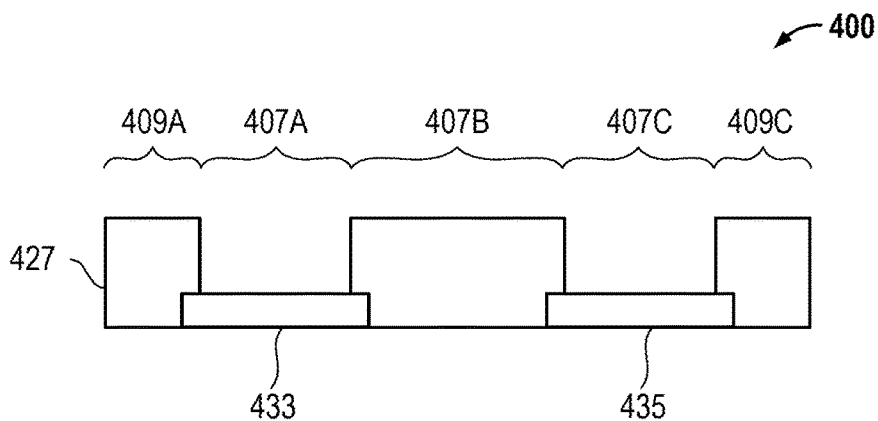

With regard now to FIG. 4D, the resist layer 401 may be processed by removing the top and bottom resist layers 401A-B to uncover top surfaces of the buildup film 427, the pad 433, and the pad 435. Any suitable technique may be used for removal of the resist layer 401. Examples include, but are not limited to, any known technique of photoresist stripping (e.g., organic stripping, inorganic stripping, dry stripping, etc.).

Figure 4E:
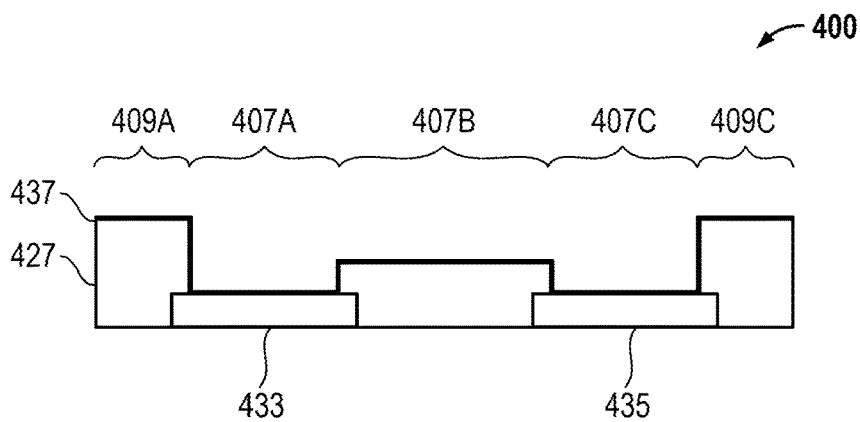
Figure 4F:
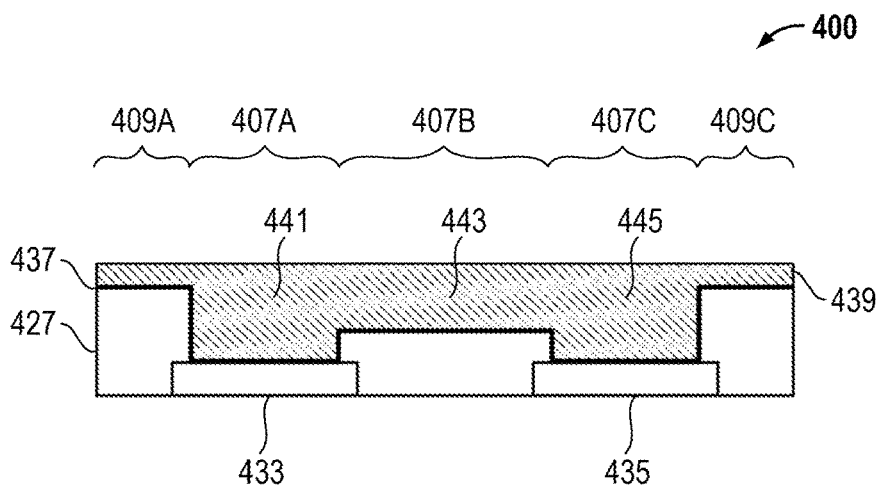
Figure 4G:
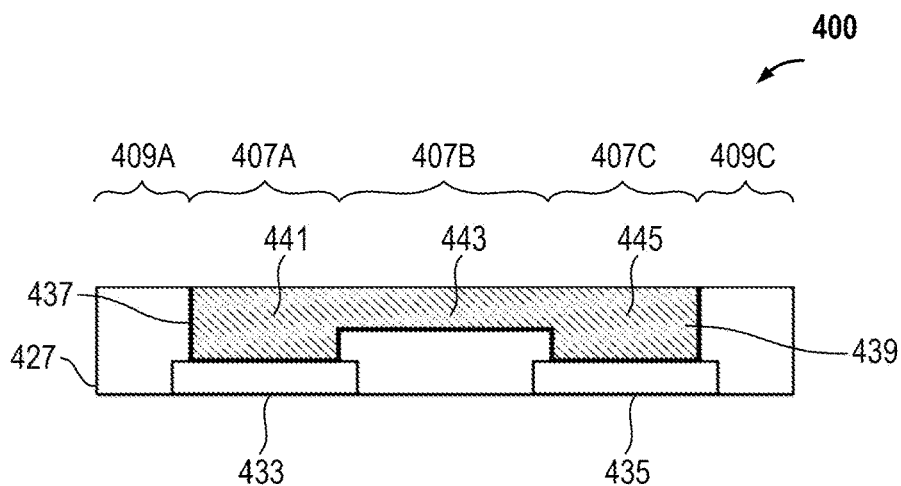

Referring now to FIGS. 4E-4G, metallization of two dual-damascene ZMVs and a trace between the ZMVs is illustrated. With specific regard to FIG. 4E, a seed layer 437 is deposited over the uncovered top surfaces of the buildup film 427 and the pads 433, 435. The seed layer 437 can be similar to or the same as the seed layer 337 described above in connection with FIG. 3E.

Moving on to FIGS. 4F-4G, a metal (e.g., Cu, etc.) 439 may be plated over the deposited seed layer 437 and the excess metal 439 may be removed any suitable removal technique. For one embodiment, the plating of the metal 439 and the subsequent removal of the excess metal 439 results in simultaneous fabrication of two dual-damascene ZMVs 441, 445 and a trace 443 between the ZMVs 441, 445. The dual-damascene ZMVs 441, 445 and trace 443 can be similar to or the same as the dual-damascene ZMVs 341, 345 and trace 343 (which are described above in connection with FIGS. 3F-3G).

FIGS. 5A-5G are cross-sectional side view illustrations of a method of forming a package layer 500 that includes at least one dual-damascene ZMV according to one embodiment. The process described shown in FIGS. 5A-5G can be used to form the package layer described above in connection with FIG. 1.

Figure 5A:
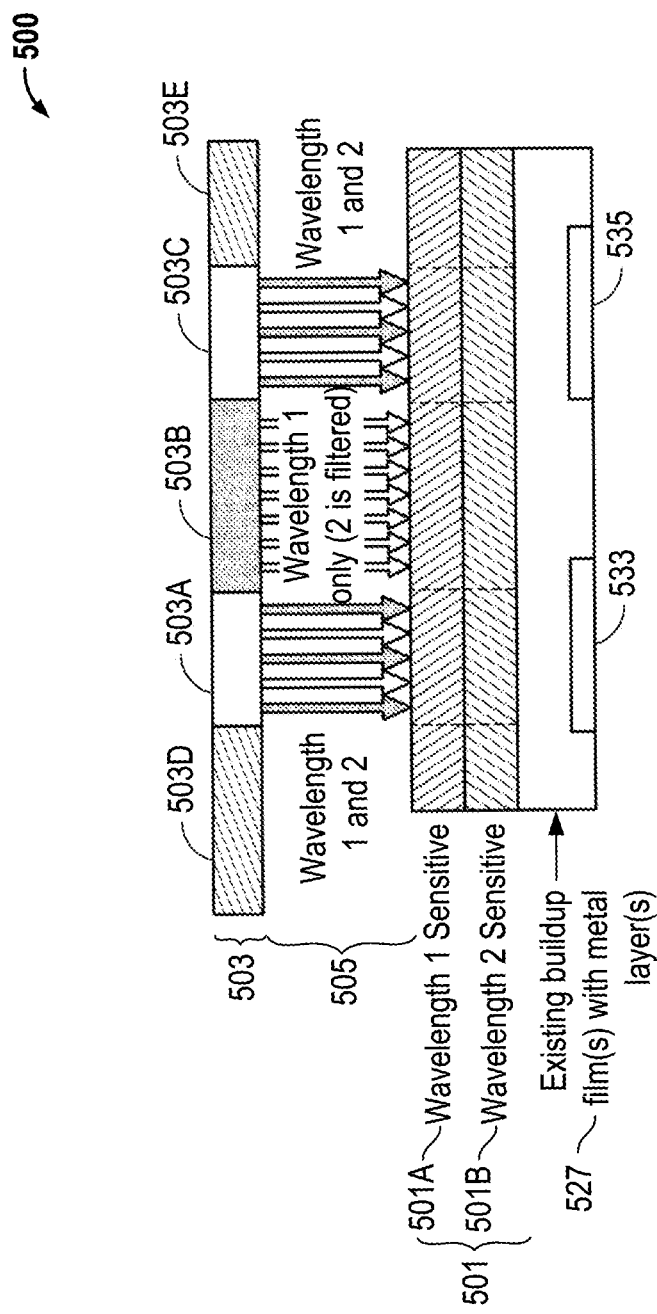
FIGS. 5A-5G are cross-sectional side view illustrations of a method of forming a package layer that includes at least one dual-damascene ZMV according to yet another embodiment.

Referring now to FIG. 5A, the method of forming the package layer 500 begins at FIG. 5A. Here, a buildup film 527 (which may include one or more build-up layers, metal layers, other layers, etc.) is provided on a substrate core (not shown). Furthermore, pads 533, 535 are formed within the buildup film 527. As shown, top sides of the pads 533, 535 are not co-planar with a top side of the buildup film 527. Next, a resist layer 501 is deposited on the buildup film 527.

In one embodiment, the resist layer 501 comprises two resist layers 501A-B. In one embodiment, the bottom resist layer 501B is deposited on a top side of the buildup film 527 and a top resist layer 501A is deposited on a top side of the bottom resist layer 501B. In one embodiment, the two resist layers 501A-B are sensitive or responsive to different wavelengths of the light 505 than each other. That is, the resist layers 501A-B have different spectral sensitivities from each other. For example, the top resist layer 501A has a first spectral sensitivity that is responsive to a first wavelength of the light 505 and the bottom resist layer 501B has a second spectral sensitivity that is responsive to a second wavelength of the light 505, where first and second spectral sensitivities are different from each other, where the first wavelength corresponds to the first spectral sensitivity, and where the second wavelength corresponds to the second spectral sensitivity. The first wavelength may be shorter or longer than the second wavelength. Examples of resist layers 501A-B include, but are not limited to, a photo resist whose spectral sensitivity is in the range of short wavelengths and a photo resist whose spectral sensitivity is in the range of long wavelengths.

Referring again to FIG. 5A, which also includes a lithographic photomask 503. The photomask 503 may be used, via exposure to light 505 (e.g., laser beams, etc.), to form latent images in the resist layer 501. In one embodiment, the photomask 503 includes one or more filters 503A-E, where the filters comprise: (i) a first set of filters 503A, 503C that do not filter wavelengths of the light 505 that correspond to spectral sensitivities of both the first and second wavelengths of the layers 501A-B; (ii) a second set of filters 503D, 503E that filter wavelengths of the light 505 that correspond to spectral sensitivities of both the first and second wavelengths of the layers 501A-B, respectively; and (iii) a third filter 503B that filters only one of the wavelengths of the light 505 that correspond to spectral sensitivities of both the first and second wavelengths of the layers 501A-B, respectively.

In one embodiment, and as shown in FIG. 5A, the photomask 503 allows for the light 505 to be binary modulated (e.g., all of the light 505 passes through the photomask 503, etc.). For example, filters 503A and 503C allow all of the light 505 to pass through the photomask 503 and treat portions of the resist layer 501. As shown in FIG. 5A, the first and second resist layers 501A-B are selectively exposed to light 505 (e.g., laser beams), which correspond in wavelengths to the two kinds of resist layers 501A-B. The filters 503A-C determine which portions of the resist layer 501 are developed, as explained above. The wavelengths of the light 505 that match the spectral sensitivities of the first and second resist layers 501A-B may be determined through testing or empirically.

Figure 5B:
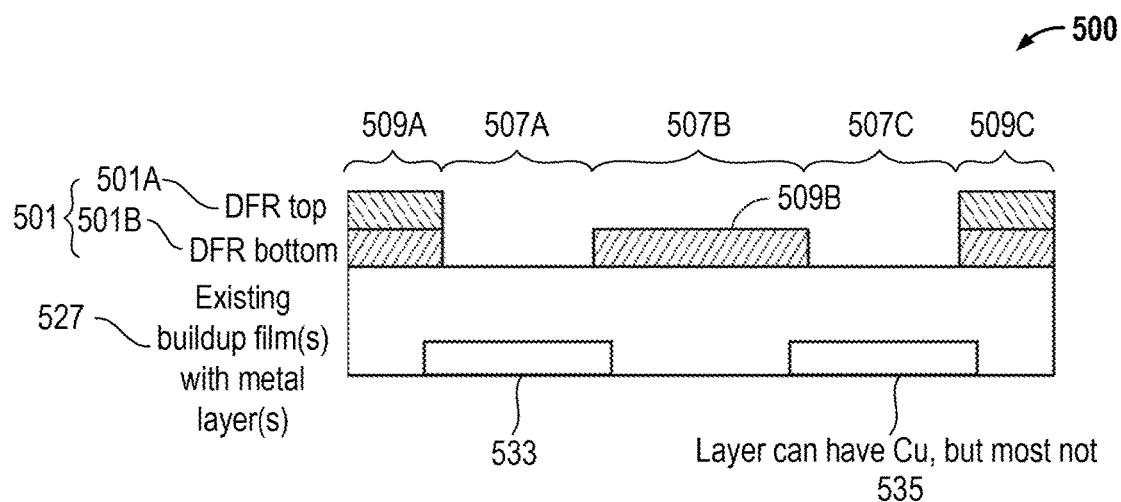

Referring now to FIG. 5B, the resist layer 501 is rinsed with an appropriate solvent. Furthermore, exposed areas of the resist layer 501 may be processed to form cavities 507A-C by wet or dry etching, lift-off, doping, or any other suitable process. In one embodiment, dry etching is used to form the cavities 507A-C. Examples of dry etching include, but are not limited to, an ICP-RIE process and an RIE process. As shown, the process of forming cavities 507A-507C can be performed in single operation that includes processing exposed areas of the resist layer 501 without processing the unexposed areas of the resist layer 501. Following the processing of the exposed areas of the resist layer 501, the package layer 500 includes pillars 509A-C and cavities 507A-C. The cavities 507A, 507C uncover a top surface of the buildup film 527 (e.g., one or more buildup layers with metal layer(s) having pads 533 and 535, etc.). Also, the cavity 507B uncovers a top surface of a pillar 509B. The pillar 509B is formed from the resist layer 501B. The pillars 509A, 509C are formed from the resist layers 501A-B.

Figure 5C:
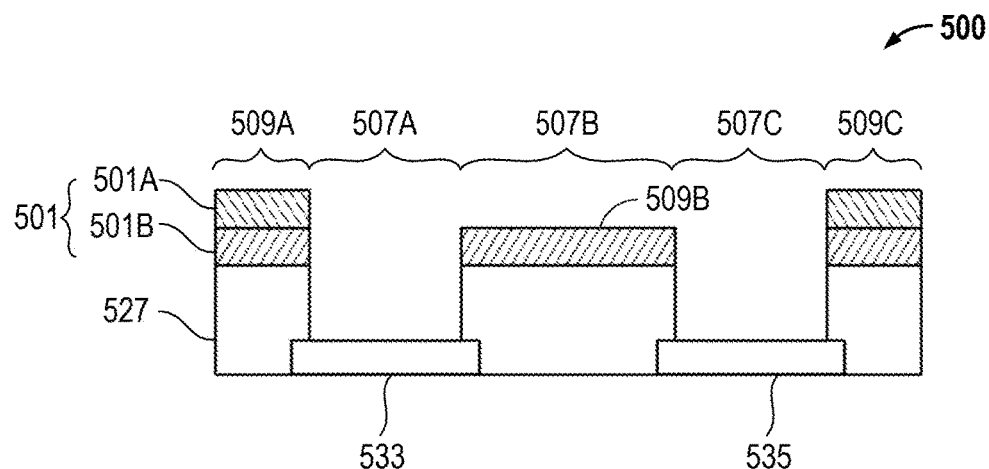

With regard now to FIG. 5C, the cavities 507A and 507C may be further processed to remove additional portions of the buildup film 527. Any suitable technique, such as wet or dry etching, may be used for removal of these additional portions of the buildup film 527. In one embodiment, the cavities 507A and 507C are further processed to uncover top surfaces of the pads 533 and 535, respectively.

Figure 5D:
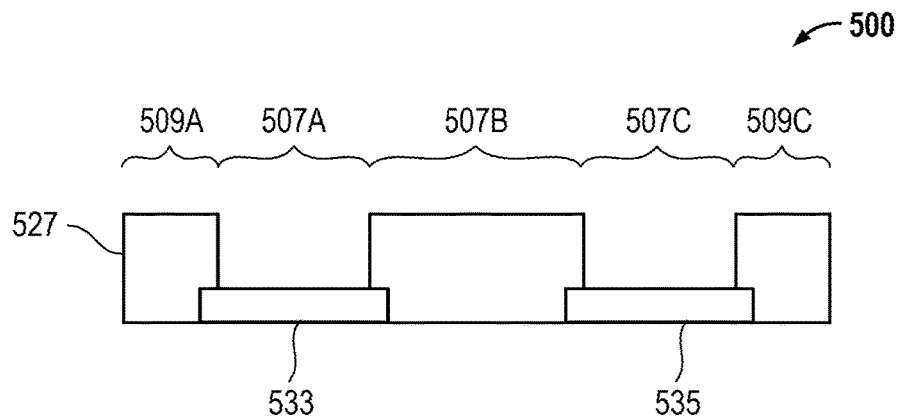

With regard now to FIG. 5D, the resist layer 501 may be processed by removing the top and bottom resist layers 501A-B to uncover top surfaces of the buildup film 527, the pad 533, and the pad 535. Any suitable technique may be used for removal of the resist layer 501. Examples include, but are not limited to, any known technique of photoresist stripping (e.g., organic stripping, inorganic stripping, dry stripping, etc.).

Figure 5E:
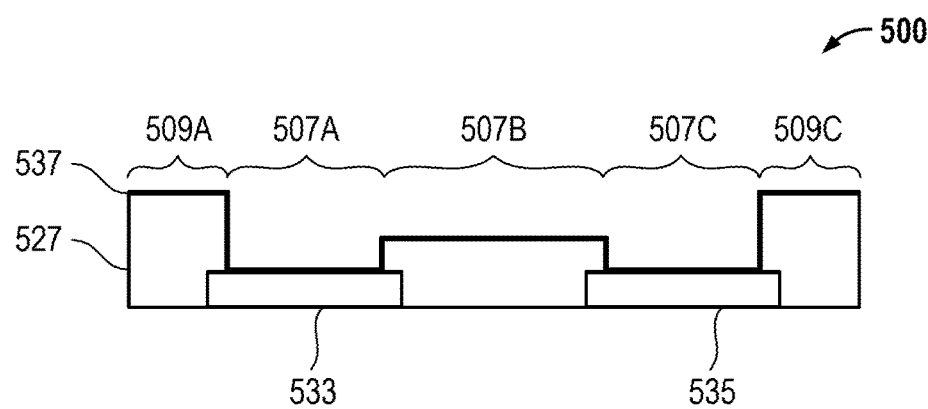
Figure 5F:
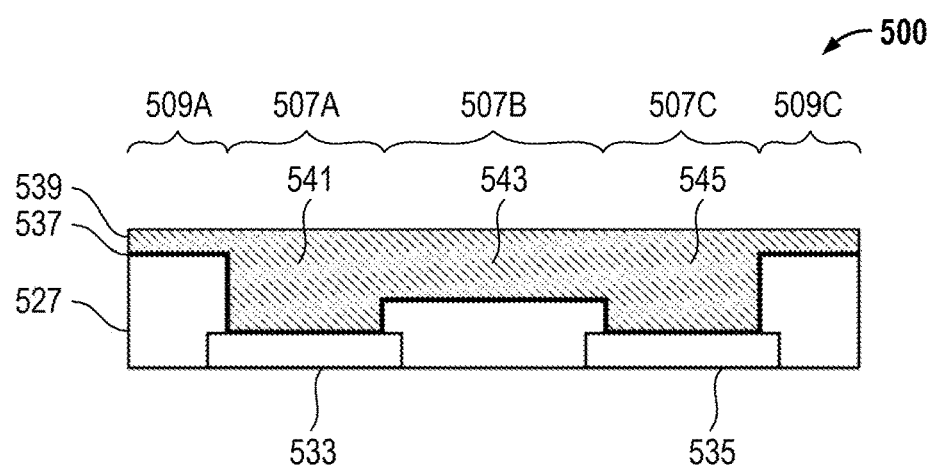
Figure 5G:
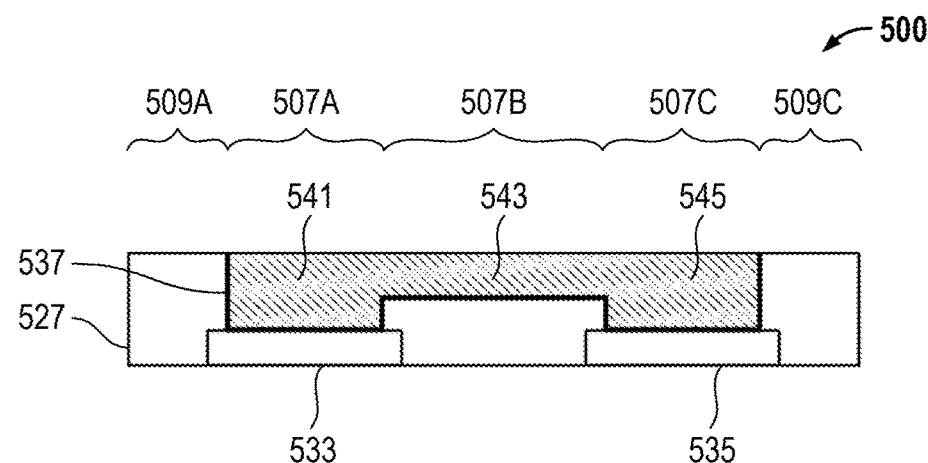

Referring now to FIGS. 5E-5G, metallization of two dual-damascene ZMVs and a trace between the ZMVs is illustrated. With specific regard to FIG. 5E, a seed layer 537 is deposited over the uncovered top surfaces of the buildup film 527 and the pads 533, 535. The seed layer 537 can be similar to or the same as the seed layers 337 and 437 described above in connection with FIGS. 3E and 4E, respectively.

Moving on to FIGS. 5F-5G, a metal (e.g., Cu, etc.) 539 may be plated over the deposited seed layer 537 and the excess metal 539 may be removed any suitable removal technique. For one embodiment, the plating of the metal 539 and the subsequent removal of the excess metal 539 results in simultaneous fabrication of two dual-damascene ZMVs 541, 545 and a trace 543 between the ZMVs 541, 545. The dual-damascene ZMVs 541, 545 and trace 543 can be similar to or the same as the dual-damascene ZMVs 341, 345 and trace 343 (which are described above in connection with FIGS. 3F-3G).

FIGS. 6A-6E are cross-sectional side view illustrations of a method of forming a package layer 600 that includes at least one dual-damascene ZMV according to yet another embodiment. The process described shown in FIGS. 6A-6E can be used to form the package layer described above in connection with FIG. 2.

Figure 6A:
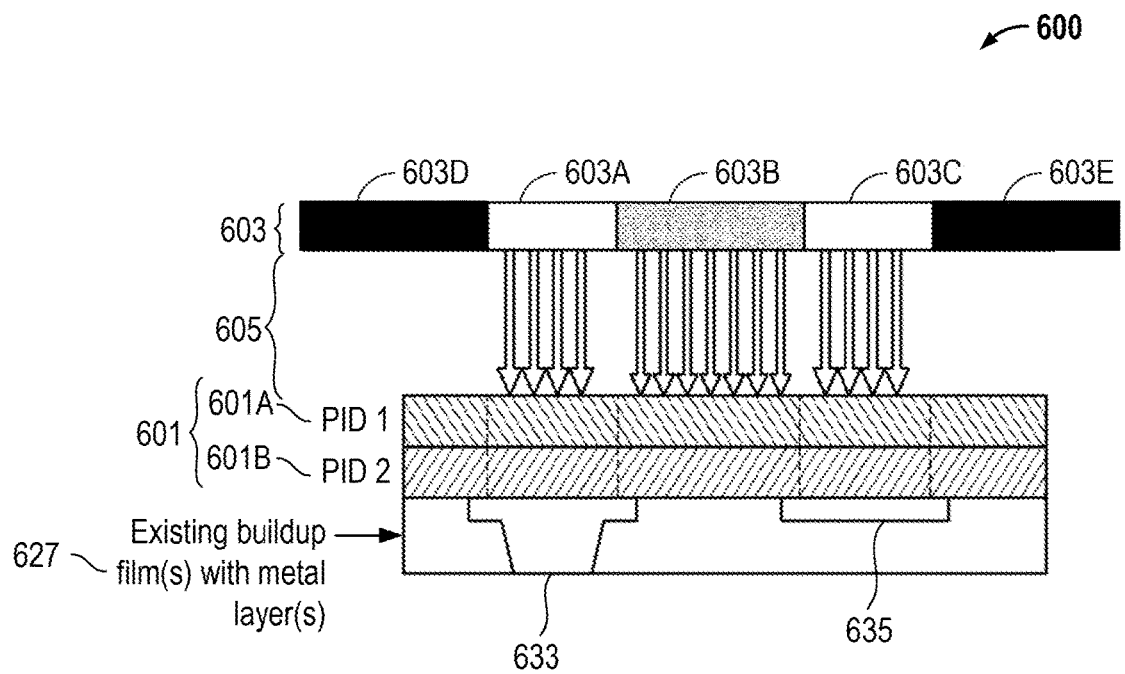
FIGS. 6A-6E are cross-sectional side view illustrations of a method of forming a package layer that includes at least one dual-damascene ZMV according to yet another embodiment.

Referring now to FIG. 6A, the method of forming the package layer 600 begins here. A buildup film 627 (e.g., one or more build-up layers, metal layers, other layers, etc.) is provided on a substrate core (not shown). Also, pads 633, 635 are formed within the buildup film 627. As shown, top sides of the pads 633, 635 are co-planar with a top side of the buildup film 627. Furthermore, a photoimageable dielectric (PID) layer 601 is deposited on the buildup film 627. Specifically, and in one embodiment, the PID layer 601 comprises two layers 601A-B formed from PID dielectrics, which may be in film form, paste form, or liquid form. In one embodiment, the PID resist layer 601B is deposited on a top side of the buildup film 627 and a top PID layer 601A is deposited on a top side of the bottom PID layer 601B. In one embodiment, the two PID layers 601A-B have different exposure dose requirements from each other. For example, the top PID layer 601A is responsive to a first exposure dose and the bottom PID layer 601B is responsive to a second exposure dose that differs from the first exposure dose. Furthermore, the PID layer 601 (i.e., both layers 601A-B) may be formed from positive or negative PID dielectrics. In one embodiment, the two PID layers 601A-B are sensitive or responsive to different wavelengths of the light 605 than each other. That is, the PID layers 601A-B have different spectral sensitivities from each other. For example, the top PID layer 601A has a first spectral sensitivity that is responsive to a first wavelength of the light 605 and the bottom PID layer 601B has a second spectral sensitivity that is responsive to a second wavelength of the light 605, where first and second spectral sensitivities are different from each other and where the first and second wavelengths are different from each other. The first wavelength may be shorter or longer than the second wavelength. Examples of PID layers 601A-B include, but are not limited to, a PID dielectric whose spectral sensitivity is in the range of short wavelengths and a PID dielectric whose spectral sensitivity is in the range of long wavelengths.

Referring again to FIG. 6A, which also includes a lithographic photomask 603. The photomask 603 may be used, via exposure to light 605, to form latent images in the resist layer 601. In one embodiment, the photomask 603 is a gray-scale photomask that includes one or more gray-scale regions 603A-E, where the gray-scale regions comprise: (i) transparent gray-scale regions 603A, 603C; (ii) opaque regions 603D, 603E; and (iii) a semi-opaque region 603B. A gray-scale photomask comprising multiple regions is described above. In one embodiment, the photomask 603 includes one or more filters 603A-E, where the filters comprise: (i) a first set of filters 603A, 603C that do not filter wavelengths of the light 605 that correspond to spectral sensitivities of both the first and second wavelengths of the layers 601A-B; (ii) a second set of filters 603D, 603E that filter wavelengths of the light 605 that correspond to spectral sensitivities of both the first and second wavelengths of the layers 601A-B, respectively; and (iii) a third filter 603B that filters only one of the wavelengths of the light 605 that correspond to spectral sensitivities of both the first and second wavelengths of the layers 601A-B, respectively.

In one embodiment, the photomask 603 allows for the light 605 to be binary modulated (e.g., all of the light 605 passes through the photomask 603, etc.). For example, regions/filters 603A and 603C allow all of the light 605 to pass through the photomask 603 and treat portions of the PID layer 601.

In embodiments that include using doses of UV light and regions 603A-E, a dose of the UV light 605 that passes through the regions 603A, 603C treats portions of the PID layer 601 below the regions 603A and 603C such that those portions are fully developed. In a further embodiment, a dose of the light 605 that passes through the region 603B treats portions of the PID layer 601 below the region 603B such that those portions are partially developed. Development of layers using light (e.g., UV light) is described above in connection with at least FIGS. 3A-4G.

In embodiments that include using wavelengths of light 605 with filters 603A-E, the first and second PID layers 601A-B are selectively exposed to light 605 (e.g., laser beams, etc.), which correspond in wavelengths to the two kinds of PID layers 601A-B. The wavelengths of the light 605 that match the spectral sensitivities of the first and second PID layers 601A-B may be determined through testing or empirically.

Figure 6B:
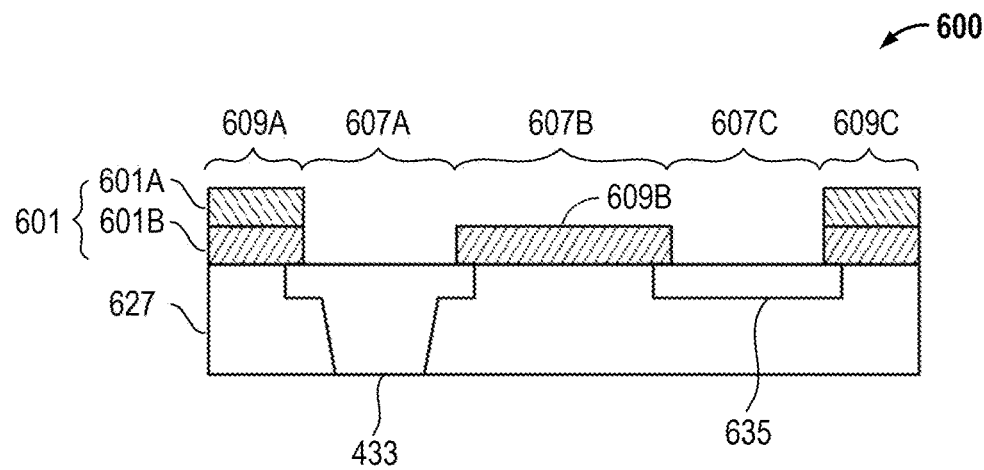

Referring now to FIG. 6B, the PID layer 601 is rinsed with an appropriate solvent. Furthermore, exposed areas of the PID layer 601 may be processed to form cavities 607A-C by wet or dry etching, lift-off, doping, or any other suitable process. In one embodiment, dry etching techniques are not required to form the cavities 607A-C. Instead, the cavities 607A-C may be formed via other etching techniques. As shown, the process of forming cavities 607A-607C can be performed in single operation that includes processing exposed areas of the PID layer 601 without processing the unexposed areas of the PID layer 601. Following the processing of the exposed areas of the PID layer 601, the package layer 600 includes pillars 609A-C and cavities 607A-C. The cavities 607A, 607C uncover a top surface of the buildup film 627 (e.g., one or more buildup layers with metal layer(s) having pads 633 and 635, etc.). Also, the cavity 607B uncovers a top surface of a pillar 609B, where the pillar 609B is formed from the PID layer 601B. The pillars 609A, 609C are formed from the PID layers 601A-B.

Figure 6C:
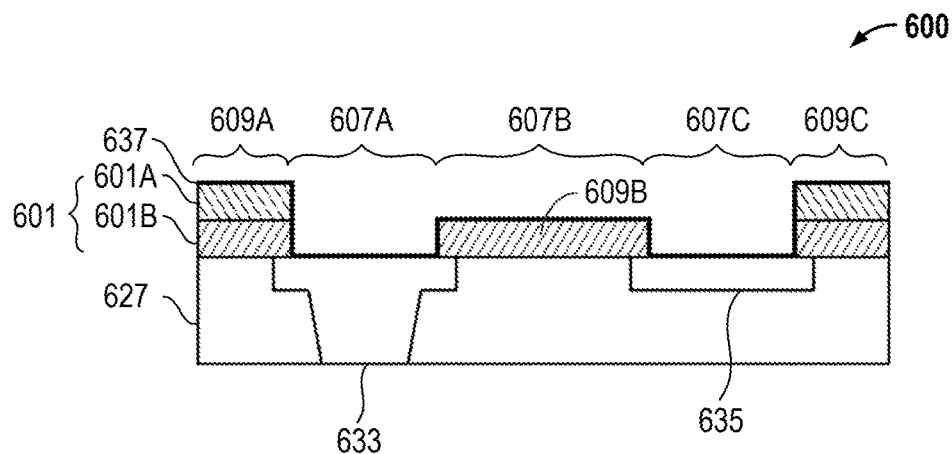
Figure 6D:
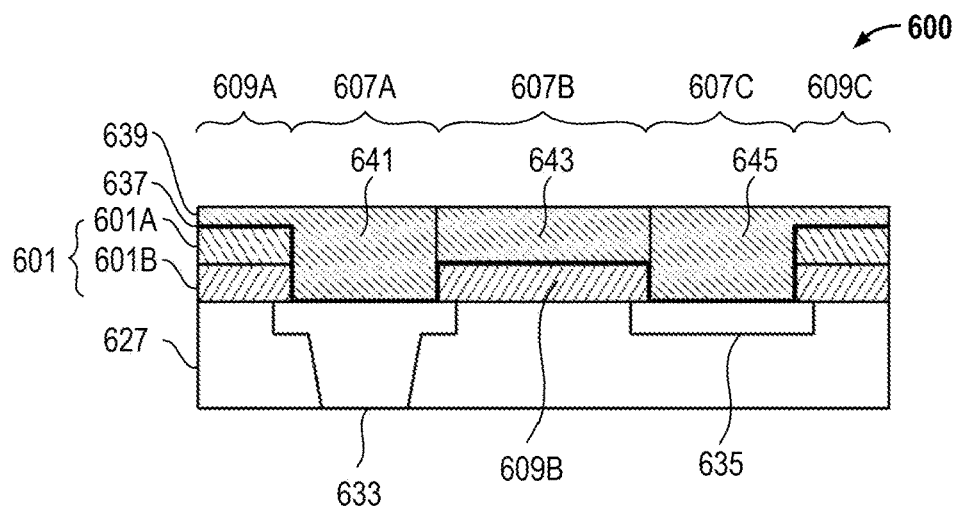
Figure 6E:
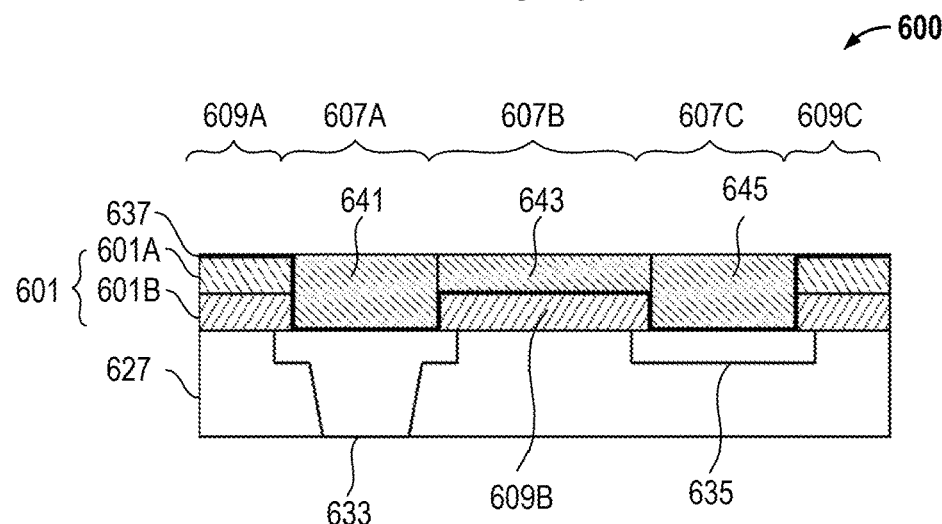

Referring now to FIGS. 6C-6E, metallization of two dual-damascene ZMVs and a trace between the ZMVs is illustrated. With specific regard to FIG. 6C, a seed layer 637 is deposited over the uncovered top surfaces of the PID layers 601A-B, the pad 633, and the pad 635. The seed layer 637 can be similar to or the same as the seed layers described above in connection with FIG. 3E, 4E, or 5E.

Moving on to FIGS. 6D-6E, a metal (e.g., Cu, etc.) 639 may be plated over the deposited seed layer 637 and the excess metal 639 may be removed any suitable removal technique. For one embodiment, the plating of the metal 639 and the subsequent removal of the excess metal 639 results in simultaneous fabrication of two dual-damascene ZMVs 641, 645 and a trace 643 between the ZMVs 641, 645. The two dual-damascene ZMVs 641, 645 and trace 643 are similar to the dual-damascene ZMVs 341, 345 and trace 343 described above in connection with at least FIGS. 3F-3G.

Figure 7A:
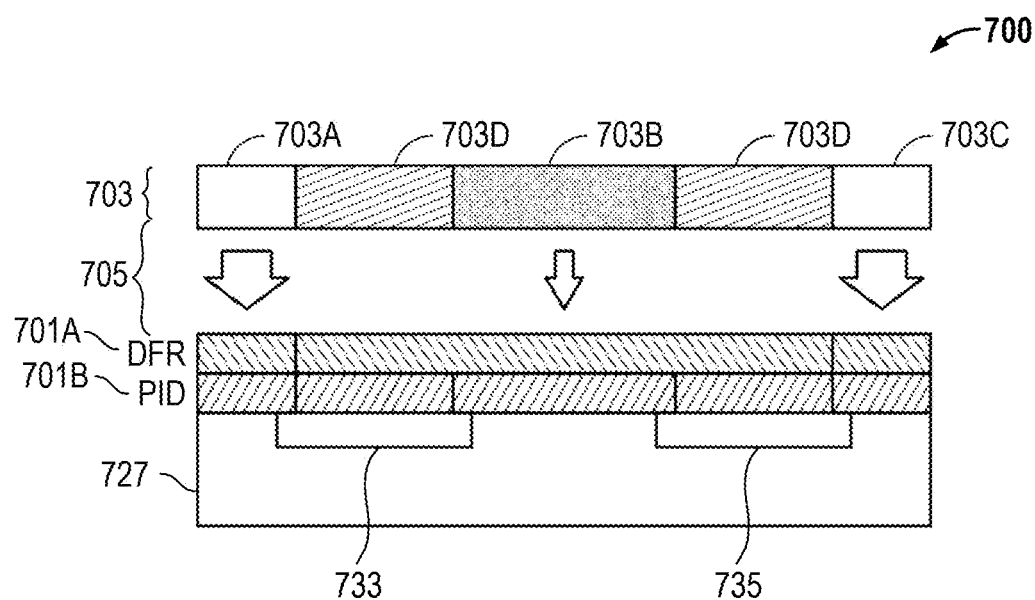
FIGS. 7A-7E are cross-sectional side view illustrations of a method of forming a package layer that includes at least one dual-damascene ZMV according to one more embodiment.

FIGS. 7A-7E are cross-sectional side view illustrations of a method of forming a package layer 700 that includes at least one dual-damascene ZMV according to one more embodiment. Referring now to FIG. 7A, the method of forming the package layer 700 begins here. A buildup film 727 (e.g., one or more build-up layers, metal layers, other layers, etc.) is provided on a substrate core (not shown). Also, pads 733, 735 are formed within the buildup film 727. As shown, top sides of the pads 733, 735 are co-planar with a top side of the buildup film 727. Furthermore, a PID layer 701B may be deposited on the buildup film 727. The PID layer 701B may be formed from negative or positive PID dielectrics, which may be in film form, paste form, or liquid form. In one embodiment, the PID layer 701B is deposited on a top side of the buildup film 727 and a resist layer 701A is deposited on a top side of the PID layer 701B. The resist layer 701A may be formed from any known resist material (e.g., positive resist materials, negative resist materials, etc.). In one embodiment, the resist layer 701A comprises a dry resist film. In one embodiment, the resist layer 701A comprises a dry resist film.

In embodiments where the both layers 701A-B are both formed negative materials, the PID layer 701B is more photosensitive (e.g., 2-4 times more photosensitive, etc.) than the resist layer 701A. In embodiments where the both layers 701A-B are both formed positive materials, the PID layer 701B is less photosensitive (e.g., 2-4 times less photosensitive, etc.) than the resist layer 701A. For example, the top resist layer 701A is responsive to a first exposure dose and the bottom PID layer 701B is responsive to a second exposure dose that differs from the first exposure dose. In one embodiment, the two layers 701A-B are sensitive or responsive to different wavelengths of the light 705 than each other. That is, the layers 701A-B have different spectral sensitivities from each other. For example, the top resist layer 701A has a first spectral sensitivity that is responsive to a first wavelength of the light 705 and the bottom PID layer 701B has a second spectral sensitivity that is responsive to a second wavelength of the light 705, where first and second spectral sensitivities are different from each other and where the first and second wavelengths are different from each other. The first wavelength may be shorter or longer than the second wavelength. Examples of layers 701A-B include, but are not limited to, a PID dielectric or resist material whose spectral sensitivity is in the range of short wavelengths and a PID dielectric or resist material whose spectral sensitivity is in the range of long wavelengths.

Referring again to FIG. 7A, which also includes a lithographic photomask 703. The photomask 703 may be used, via exposure to light 705, to form latent images in the resist layer 701A and the PID layer 701B. In one embodiment, the photomask 703 is a gray-scale photomask that includes one or more gray-scale regions 703A-E, where the gray-scale regions comprise: (i) transparent regions 703A, 703C; (ii) opaque gray-scale regions 703D, 703E; and (iii) a semi-opaque gray-scale region 703B.

Gray-scale photomasks that include regions are described above. In one embodiment, the photomask 703 includes one or more filters 703A-E, where the filters comprise: (i) a first set of filters 703A, 703C that do not filter wavelengths of the light 705 that correspond to spectral sensitivities of both the first and second wavelengths of the layers 701A-B; (ii) a second set of filters 703D, 703E that filter wavelengths of the light 705 that correspond to spectral sensitivities of both the first and second wavelengths of the layers 701A-B, respectively; and (iii) a third filter 703B that filters only one of the wavelengths of the light 705 that correspond to spectral sensitivities of both the first and second wavelengths of the layers 701A-B, respectively.

In one embodiment, the photomask 703 allows for the light 705 to be binary modulated (e.g., all of the light 705 passes through the photomask 703, etc.). For example, masks/filters 703A and 703C allow all of the light 705 to pass through the photomask 703 and treat portions of the layers 701A-B.

In embodiments that include using doses of UV light and regions 703A-E, a dose of the UV light 705 that passes through the regions 703A, 703C treats portions of the layers 701A-B below the regions 703A and 703C such that those portions are fully developed. In a further embodiment, a dose of the light 705 that passes through the region 703B treats portions of the layers 701A-B below the region 703B such that those portions are partially developed. Development of layers using light (e.g., UV light) is described above in connection with at least FIGS. 3A-4G.

In embodiments that include using wavelengths of light 705 with filters 703A-E, the first and second layers 701A-B are selectively exposed to light 705 (e.g., laser beams, etc.), which correspond in wavelengths to the two kinds of layers 701A-B. The wavelengths of the light 705 that match the spectral sensitivities of the first and second layers 701A-B may be determined through testing or empirically.

Figure 7B:
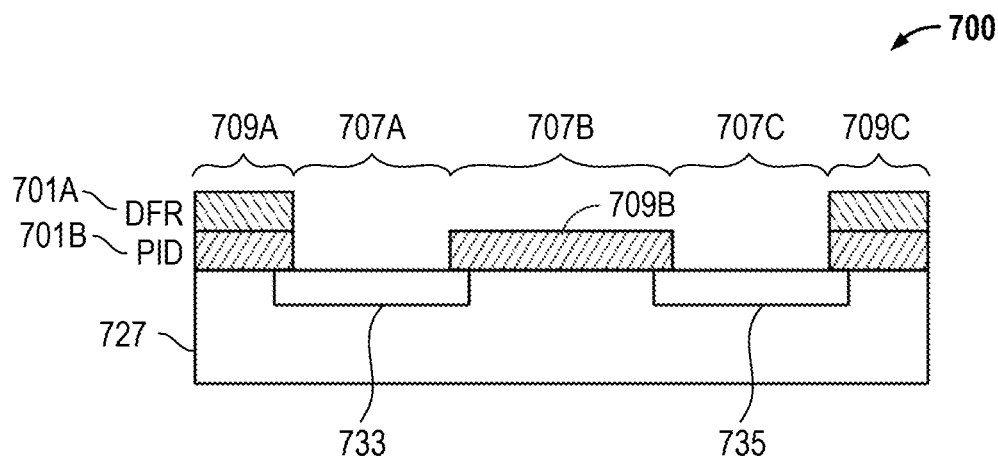

Referring now to FIG. 7B, the layers 701A-B are rinsed with an appropriate solvent. Furthermore, unexposed areas of the layers 701A-B may be processed to form cavities 707A-C by wet or dry etching, lift-off, doping, or any other suitable process. As shown, the process of forming cavities 707A-C can be performed in single operation that includes processing unexposed areas of the layers 701A-C without processing the exposed areas of the layers 701A-C. Following the processing of the unexposed areas of the layers 701A-B, the package layer 700 includes pillars 709A-C and cavities 707A-C. The cavities 707A, 707C uncover a top surface of the buildup film 727 (e.g., one or more buildup layers with metal layer(s) having pads 733 and 735, etc.). Also, the cavity 707B uncovers a top surface of a pillar 709B, where the pillar 709B is formed from the PID layer 701B. The pillars 709A, 709C are formed from the layers 701A-B. In one embodiment, the PID layer 701B defines two dual-damascene ZMVs to be formed while the resist layer 701A defines a trace between the ZMVs.

Figure 7C:
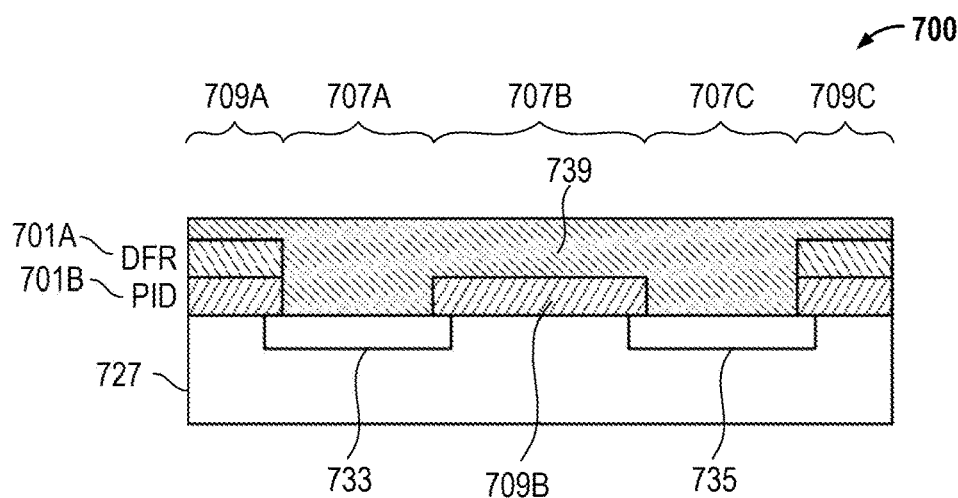
Figure 7D:
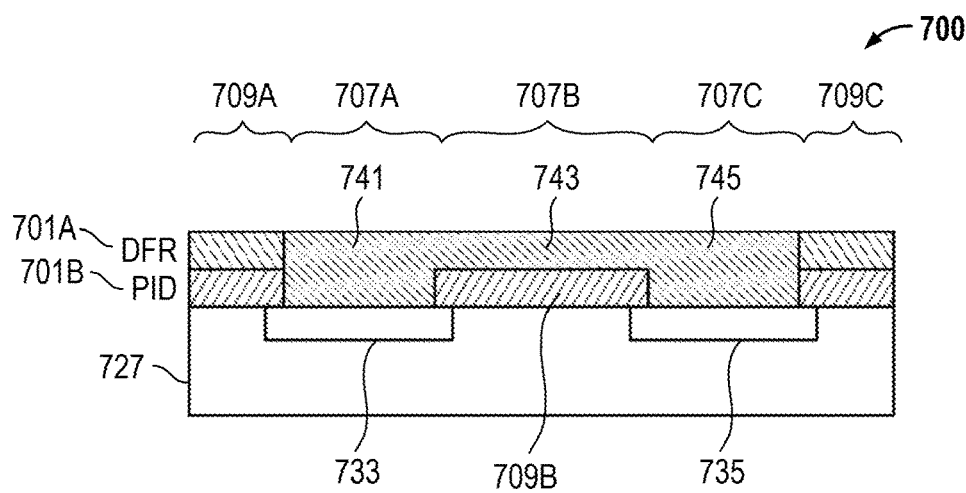
Figure 7E:
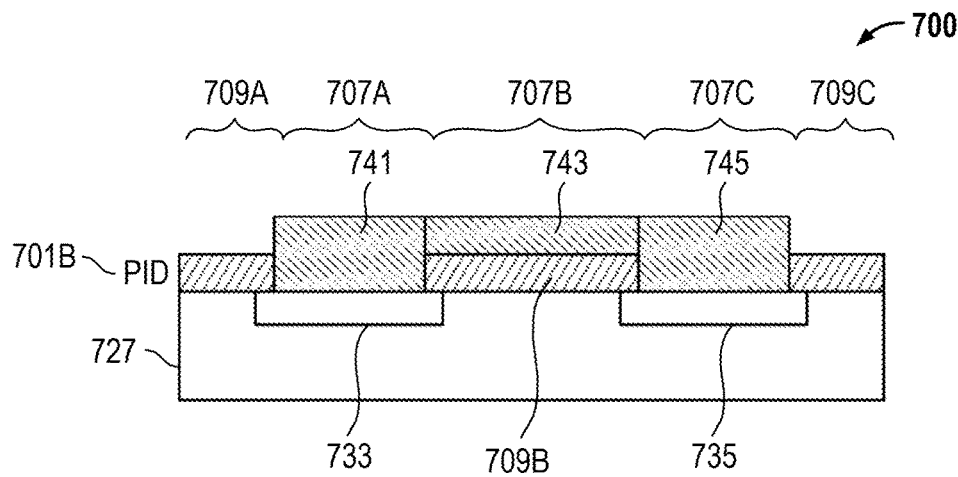

Referring now to FIGS. 7C-7E, metallization of two dual-damascene ZMVs and a trace between the ZMVs is illustrated. With specific regard to FIG. 7C, a seed layer (not shown) is deposited over the uncovered top surfaces of the layers 701A-B, the pad 733, and the pad 735. The seed layer 637 can be similar to or the same as the seed layers described above in connection with FIG. 3E, 4E, or 5E. Also, and with regard to FIG. 7C, a metal (e.g., Cu, etc.) 739 may be plated over the deposited seed layer to fill up the cavities 707A-C, encapsulate the pillar 709B, and cover top sides of the pillars 709, 709C.

Referring to FIG. 7D, the excess metal 739 may be removed any suitable removal technique. As shown in FIG. 7D, the removal of excess metal 739 may be performed through a buffing or polishing process (e.g., CMP, etc.). Furthermore, the excess metal is buffered or polished until a top side of the resist layer 701A is co-planar with a top side of the metal 739.

With regard now to FIG. 7E, the resist layer 701A is removed or stripped away. Any suitable stripping or removal technique for resist materials may be used. For one embodiment, the plating of the metal 739, the subsequent removal of the excess metal 739 and resist layer 701A results in simultaneous fabrication of two dual-damascene ZMVs 741, 745 and a trace 743 between the ZMVs 741, 745. The two dual-damascene ZMVs 741, 745 and trace 743 are similar to the dual-damascene ZMVs 741, 745 and trace 743 described above in connection with at least FIGS. 3F-3G.

Figure 8:
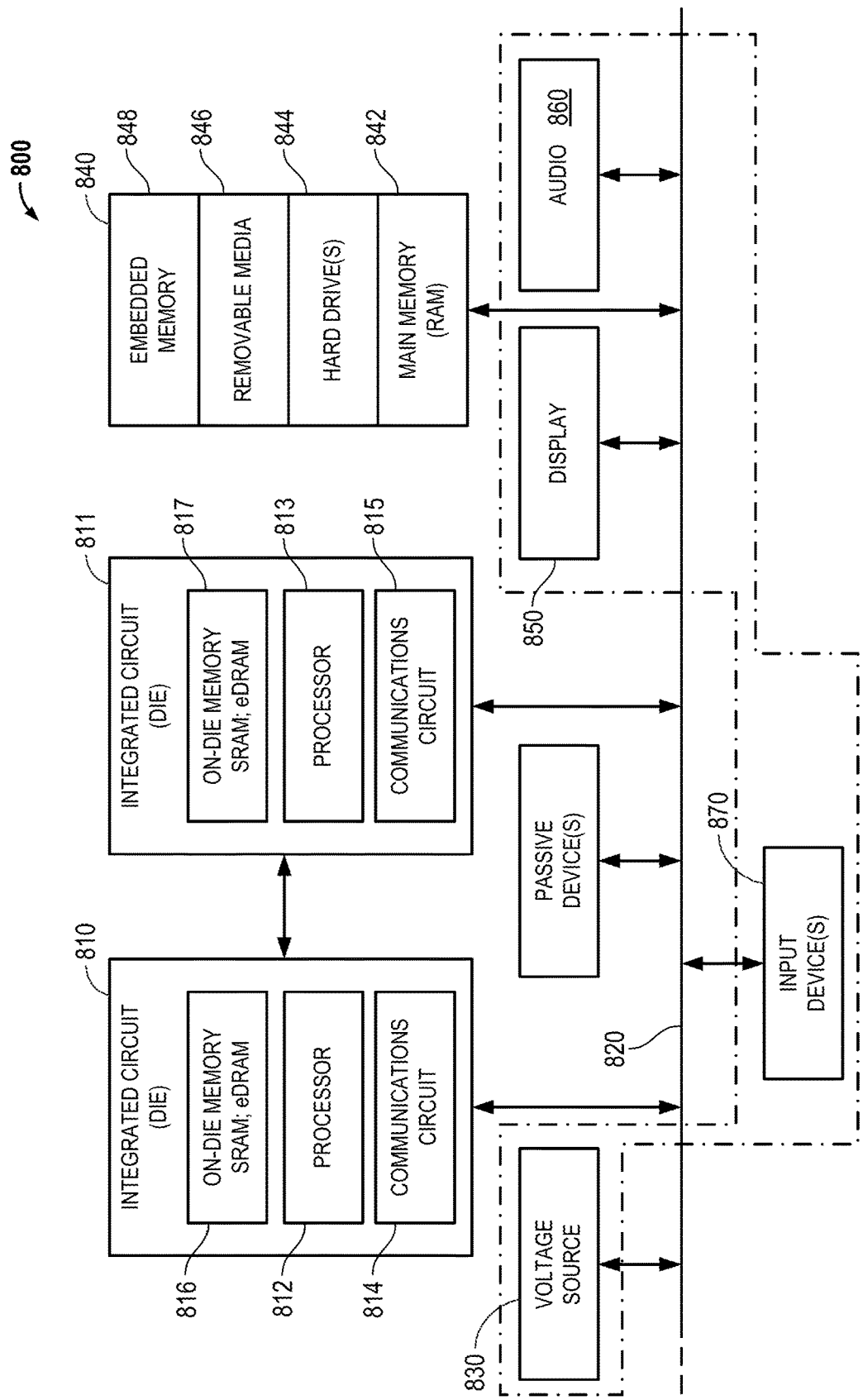
FIG. 8 is an illustration of a schematic block diagram of a computer system that utilizes a semiconductor package, according to an embodiment.

FIG. 8 illustrates a schematic of computer system 800 according to an embodiment. The computer system 800 (also referred to as an electronic system 800) can include a semiconductor package that includes at least one dual-damascene ZMV and/or a trace in accord with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The electronic system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package that includes at least one dual-damascene ZMV and/or a trace in accord with any of the embodiments and their equivalents, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers.

For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged with a process in accord with any of the embodiments and their equivalents, as described in the foregoing specification.

For an embodiment, the integrated circuit 810 is complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package that includes at least one dual-damascene ZMV and/or a trace as described herein, an electronic system, a computer system, one or more methods of fabricating an integrated circuit, and one or more methods of fabricating an electronic assembly that includes a semiconductor package that includes at least one dual-damascene ZMV and/or a trace, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor packages that includes at least one dual-damascene ZMV and/or a trace in accordance with any of the several disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a semiconductor package, the method comprising: depositing a first resist layer on a buildup film, wherein one or more metal pads are formed in the buildup film; depositing a second resist layer on the first resist layer; exposing portions of the first and second resist layers using light that passes through a photomask; removing portions of the first and second resist layers to form a plurality of cavities and a plurality of pillars, wherein two of the cavities uncover a top side of the buildup film, wherein one of the cavities uncovers a top side of a pillar formed from the first resist layer, and wherein two of the pillars are formed from the first and second resist layers; removing any remaining portions of the resist layers to reveal top surfaces of the buildup film and the one or more metal pads; plating a conductive material into the cavities to fill the cavities and cover top sides of the buildup film and the one or more metal pads; and polishing the conductive material such that top sides of the buildup film are co planar with a top side of the conductive material, wherein the polished conductive material forms a plurality of dual-damascene zero misalignment vias (ZMVs) and a trace between the plurality of dual-damascene ZMVs.

Additional embodiments include a method, wherein the first resist layer responds to a first dose of the light and the second resist layer responds to a second dose of the light and wherein the first and second doses differ from each other.

Additional embodiments include a method, wherein the photomask comprises one or more regions.

Additional embodiments include a method, wherein each of the first and second resist layers is formed from a positive resist material.

Additional embodiments include a method, wherein removing portions of the first and second resist layers to form a plurality of cavities and a plurality of pillars comprises removing exposed portions of the first and second resist layers without removing the unexposed portions of the first and second resist layers.

Additional embodiments include a method, wherein each of the first and second resist layers is formed from a negative resist material.

Additional embodiments include a method, wherein removing portions of the first and second resist layers to form a plurality of cavities and a plurality of pillars comprises removing unexposed portions of the first and second resist layers without removing the exposed portions of the first and second resist layers.

Additional embodiments include a method, wherein the first resist layer responds to a first wavelength of the light that corresponds to a first spectral sensitivity of the first resist layer and the second resist layer responds to a second wavelength of the light that corresponds to a second spectral sensitivity of the second resist layer, wherein the first and second wavelengths differ from each other, and wherein the first and second spectral sensitivities differ from each other.

Additional embodiments include a method, wherein removing portions of the first and second resist layers to form a plurality of cavities and a plurality of pillars comprises removing exposed portions of the first and second resist layers without removing the unexposed portions of the first and second resist layers.

Additional embodiments include a method, wherein removing portions of the first and second resist layers to form a plurality of cavities and a plurality of pillars comprises removing unexposed portions of the first and second resist layers without removing the exposed portions of the first and second resist layers.

Additional embodiments include a method, wherein each of the plurality of dual-damascene ZMVs has substantially the same size as the trace.

Additional embodiments include a method, wherein the one or more metal pads has substantially the same size as the plurality of dual-damascene ZMVs or the trace.

Additional embodiments include a method, wherein top sides of the one or more metal pads are not co-planar with a top side of the buildup film.

Embodiments include a method of forming a semiconductor package, the method comprising: depositing a first photoimageable dielectric (PID) layer on a buildup film, wherein one or more metal pads are formed in the buildup film; depositing a second PID layer on the first PID layer; exposing portions of the first and second PID layers using light that passes through a photomask; removing portions of the first and second PID layers to form a plurality of cavities and a plurality of pillars, wherein two of the cavities uncover top sides of the one or more metal pads, wherein one of the cavities uncovers a top side of a pillar formed from the first PID layer, and wherein two of the pillars are formed from the first and second PID layers; plating a conductive material into the cavities to fill the cavities and cover top sides of the pillars and the one or more metal pads; and polishing the conductive material such that top sides of the pillars formed from the first and second PID layers are co planar with a top side of the conductive material, wherein the polished conductive material forms a plurality of dual-damascene zero misalignment vias (ZMVs) and a trace between the plurality of dual-damascene ZMVs.

Additional embodiments include a method, wherein the first PID layer responds to a first dose of the light and the second PID layer responds to a second dose of the light and wherein the first and second doses differ from each other.

Additional embodiments include a method, wherein the photomask comprises one or more gray scale masks.

Additional embodiments include a method, wherein each of the first and second PID layers is formed from a positive PID material.

Additional embodiments include a method, wherein removing portions of the first and second PID layers to form a plurality of cavities and a plurality of pillars comprises removing exposed portions of the first and second PID layers without removing the unexposed portions of the first and second PID layers.

Additional embodiments include a method, wherein each of the first and second PID layers is formed from a negative PID material.

Additional embodiments include a method, wherein removing portions of the first and second PID layers to form a plurality of cavities and a plurality of pillars comprises removing unexposed portions of the first and second PID layers without removing the exposed portions of the first and second PID layers.

Additional embodiments include a method, wherein the first PID layer responds to a first wavelength of the light that corresponds to a first spectral sensitivity of the first PID layer and the second PID layer responds to a second wavelength of the light that corresponds to a second spectral sensitivity of the second PID layer, wherein the first and second wavelengths differ from each other, and wherein the first and second spectral sensitivities differ from each other.

Additional embodiments include a method, wherein removing portions of the first and second PID layers to form a plurality of cavities and a plurality of pillars comprises removing exposed portions of the first and second PID layers without removing the unexposed portions of the first and second PID layers.

Additional embodiments include a method, wherein removing portions of the first and second PID layers to form a plurality of cavities and a plurality of pillars comprises removing unexposed portions of the first and second PID layers without removing the exposed portions of the first and second PID layers.

Additional embodiments include a method, wherein each of the plurality of dual-damascene ZMVs has substantially the same size as the trace.

Additional embodiments include a method, wherein the one or more metal pads has substantially the same size as the plurality of dual-damascene ZMVs or the trace.

Additional embodiments include a method, wherein top sides of the one or more metal pads are co planar with a top side of the buildup film.

Embodiments include a method of forming a semiconductor package, the method comprising: depositing a photoimageable dielectric (PID) layer on a buildup film, wherein one or more metal pads are formed in the buildup film; depositing a resist layer on the PID layer; exposing portions of the resist and PID layers using light that passes through a photomask; removing portions of the resist and PID layers to form a plurality of cavities and a plurality of pillars, wherein two of the cavities uncover top sides of the one or more metal pads, wherein one of the cavities uncovers a top side of a pillar formed from the PID layer, and wherein two of the pillars are formed from the resist and PID layers; plating a conductive material into the cavities to fill the cavities and cover top sides of the pillars and the one or more metal pads; and polishing the conductive material such that top sides of the pillars formed from the resist and PID layers are co planar with a top side of the conductive material, removing any remaining portions of the resist layer, wherein the polished conductive material that lacks the resist layer forms a plurality of dual-damascene zero misalignment vias (ZMVs) and a trace between the plurality of dual-damascene ZMVs.

Additional embodiments include a method, wherein the PID layer responds to a first dose of the light and the resist layer responds to a second dose of the light and wherein the first and second doses differ from each other.

Additional embodiments include a method, wherein the photomask comprises one or more gray scale masks.

Additional embodiments include a method, wherein each of the resist and PID layers is formed from a positive material or a negative material.

Additional embodiments include a method, wherein removing portions of the resist and PID layers to form a plurality of cavities and a plurality of pillars comprises removing unexposed portions of the resist and PID layers without removing the exposed portions of the resist and PID layers.

Additional embodiments include a method, wherein the PID layer responds to a first wavelength of the light that corresponds to a first spectral sensitivity of the PID layer and the resist layer responds to a second wavelength of the light that corresponds to a second spectral sensitivity of the resist layer, wherein the first and second wavelengths differ from each other, and wherein the first and second spectral sensitivities differ from each other.

Additional embodiments include a method, wherein removing portions of the resist and PID layers to form a plurality of cavities and a plurality of pillars comprises removing unexposed portions of the resist and PID layers without removing the exposed portions of the resist and PID layers.

Additional embodiments include a method, wherein each of the plurality of dual-damascene ZMVs has substantially the same size as the trace.

Additional embodiments include a method, wherein the one or more metal pads has substantially the same size as the plurality of dual-damascene ZMVs or the trace.

Additional embodiments include a method, wherein top sides of the one or more metal pads are co planar with a top side of the buildup film.

Embodiments include a semiconductor package comprising: a buildup film, wherein one or more metal pads are formed in the buildup film; and a plurality of dual-damascene zero misalignment vias (ZMVs) and a trace between the plurality of dual-damascene ZMVs, wherein the ZMVs connect with the one or more metal pads in the buildup film.

Embodiments include a semiconductor package comprising: a buildup film, wherein one or more metal pads are formed in the buildup film; a first photoimageable dielectric (PID) layer on the buildup film; a second PID layer on the first PID layer; and a plurality of dual-damascene zero misalignment vias (ZMVs) and a trace between the plurality of dual-damascene ZMVs, wherein the trace and the ZMVs are formed in the first and second PID layers and wherein the ZMVs connect with the one or more metal pads in the buildup film.

Embodiments include a semiconductor package comprising: a buildup film, wherein one or more metal pads are formed in the buildup film; a photoimageable dielectric (PID) layer on the buildup film; and a plurality of dual-damascene zero misalignment vias (ZMVs) and a trace between the plurality of dual-damascene ZMVs, wherein the trace and the ZMVs are formed in and on the PID layer and wherein the ZMVs connect with the one or more metal pads in the buildup film.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A method of forming a semiconductor package, the method comprising:
   depositing a first resist layer on a buildup film, wherein one or more metal pads are formed in the buildup film;
   depositing a second resist layer on the first resist layer;
   exposing portions of the first and second resist layers using light that passes through a photomask;
   removing portions of the first and second resist layers to form a plurality of cavities and a plurality of pillars, wherein two of the cavities uncover a top side of the buildup film, wherein one of the cavities uncovers a top side of a pillar formed from the first resist layer, and wherein two of the pillars are formed from the first and second resist layers;
   removing any remaining portions of the resist layers to reveal top surfaces of the buildup film and the one or more metal pads;
   plating a conductive material into the cavities to fill the cavities and cover top sides of the buildup film and the one or more metal pads; and
   polishing the conductive material such that top sides of the buildup film are co-planar with a top side of the conductive material, wherein the polished conductive material forms a plurality of dual-damascene zero misalignment vias (ZMVs) and a trace between the plurality of dual-damascene ZMVs.

2. The method of claim 1, wherein the first resist layer responds to a first dose of the light and the second resist layer responds to a second dose of the light and wherein the first and second doses differ from each other.

3. The method of claim 2, wherein the photomask comprises one or more regions.

4. The method of claim 2, wherein each of the first and second resist layers is formed from a positive resist material.

5. The method of claim 4, wherein removing portions of the first and second resist layers to form a plurality of cavities and a plurality of pillars comprises removing exposed portions of the first and second resist layers without removing unexposed portions of the first and second resist layers.

6. The method of claim 2, wherein each of the first and second resist layers is formed from a negative resist material.

7. The method of claim 4, wherein removing portions of the first and second resist layers to form a plurality of cavities and a plurality of pillars comprises removing unexposed portions of the first and second resist layers without removing the exposed portions of the first and second resist layers.

8. The method of claim 1, wherein the first resist layer responds to a first wavelength of the light that corresponds to a first spectral sensitivity of the first resist layer and the second resist layer responds to a second wavelength of the light that corresponds to a second spectral sensitivity of the second resist layer, wherein the first and second wavelengths differ from each other, and wherein the first and second spectral sensitivities differ from each other.

9. The method of claim 8, wherein removing portions of the first and second resist layers to form a plurality of cavities and a plurality of pillars comprises removing exposed portions of the first and second resist layers without removing unexposed portions of the first and second resist layers.

10. The method of claim 8, wherein removing portions of the first and second resist layers to form a plurality of cavities and a plurality of pillars comprises removing unexposed portions of the first and second resist layers without removing the exposed portions of the first and second resist layers.

11. The method of claim 1, wherein each of the plurality of dual-damascene ZMVs has substantially a same size as the trace.

12. The method of claim 11, wherein the one or more metal pads has substantially a same size as the plurality of dual-damascene ZMVs or the trace.

13. The method of claim 1, wherein top sides of the one or more metal pads are not co-planar with a top side of the buildup film.

14. A method of forming a semiconductor package, the method comprising:
    depositing a first photoimageable dielectric (PID) layer on a buildup film, wherein one or more metal pads are formed in the buildup film;
    depositing a second PID layer on the first PID layer;
    exposing portions of the first and second PID layers using light that passes through a photomask;
    removing portions of the first and second PID layers to form a plurality of cavities and a plurality of pillars, wherein two of the cavities uncover top sides of the one or more metal pads, wherein one of the cavities uncovers a top side of a pillar formed from the first PID layer, and wherein two of the pillars are formed from the first and second PID layers;
    plating a conductive material into the cavities to fill the cavities and cover top sides of the pillars and the one or more metal pads; and
    polishing the conductive material such that top sides of the pillars formed from the first and second PID layers are co-planar with a top side of the conductive material, wherein the polished conductive material forms a plurality of dual-damascene zero misalignment vias (ZMVs) and a trace between the plurality of dual-damascene ZMVs.

15. The method of claim 14, wherein the first PID layer responds to a first dose of the light and the second PID layer responds to a second dose of the light and wherein the first and second doses differ from each other.

16. The method of claim 15, wherein the photomask comprises one or more regions.

17. The method of claim 15, wherein each of the first and second PID layers is formed from a positive PID material.

18. The method of claim 17, wherein removing portions of the first and second PID layers to form a plurality of cavities and a plurality of pillars comprises removing exposed portions of the first and second PID layers without removing unexposed portions of the first and second PID layers.

19. The method of claim 15, wherein each of the first and second PID layers is formed from a negative PID material.

20. The method of claim 17, wherein removing portions of the first and second PID layers to form a plurality of cavities and a plurality of pillars comprises removing unexposed portions of the first and second PID layers without removing the exposed portions of the first and second PID layers.

21. The method of claim 14, wherein the first PID layer responds to a first wavelength of the light that corresponds to a first spectral sensitivity of the first PID layer and the second PID layer responds to a second wavelength of the light that corresponds to a second spectral sensitivity of the second PID layer, wherein the first and second wavelengths differ from each other, and wherein the first and second spectral sensitivities differ from each other.

22. The method of claim 21, wherein removing portions of the first and second PID layers to form a plurality of cavities and a plurality of pillars comprises removing exposed portions of the first and second PID layers without removing unexposed portions of the first and second PID layers.

23. The method of claim 21, wherein removing portions of the first and second PID layers to form a plurality of cavities and a plurality of pillars comprises removing unexposed portions of the first and second PID layers without removing the exposed portions of the first and second PID layers.

24. The method of claim 14, wherein each of the plurality of dual-damascene ZMVs has substantially a same size as the trace.

25. The method of claim 24, wherein the one or more metal pads has substantially a same size as the plurality of dual-damascene ZMVs or the trace.

26. The method of claim 14, wherein top sides of the one or more metal pads are co-planar with a top side of the buildup film.

27. A method of forming a semiconductor package, the method comprising:
    depositing a photoimageable dielectric (PID) layer on a buildup film, wherein one or more metal pads are formed in the buildup film;
    depositing a resist layer on the PID layer;
    exposing portions of the resist and PID layers using light that passes through a photomask;
    removing portions of the resist and PID layers to form a plurality of cavities and a plurality of pillars, wherein two of the cavities uncover top sides of the one or more metal pads, wherein one of the cavities uncovers a top side of a pillar formed from the PID layer, and wherein two of the pillars are formed from the resist and PID layers;

plating a conductive material into the cavities to fill the cavities and cover top sides of the pillars and the one or more metal pads; and polishing the conductive material such that top sides of the pillars formed from the resist and PID layers are co-planar with a top side of the conductive material, removing any remaining portions of the resist layer, wherein the polished conductive material that lacks the resist layer forms a plurality of dual-damascene zero misalignment vias (ZMVs) and a trace between the plurality of dual-damascene ZMVs.

28. The method of claim 27, wherein the PID layer responds to a first dose of the light and the resist layer responds to a second dose of the light and wherein the first and second doses differ from each other.

29. The method of claim 28, wherein the photomask comprises one or more regions.

30. The method of claim 28, wherein each of the resist and PID layers is formed from a positive material or a negative material.

31. The method of claim 30, wherein removing portions of the resist and PID layers to form a plurality of cavities and a plurality of pillars comprises removing unexposed portions of the resist and PID layers without removing the exposed portions of the resist and PID layers.

32. The method of claim 27, wherein the PID layer responds to a first wavelength of the light that corresponds to a first spectral sensitivity of the PID layer and the resist layer responds to a second wavelength of the light that corresponds to a second spectral sensitivity of the resist layer, wherein the first and second wavelengths differ from each other, and wherein the first and second spectral sensitivities differ from each other.

33. The method of claim 32, wherein removing portions of the resist and PID layers to form a plurality of cavities and a plurality of pillars comprises removing unexposed portions of the resist and PID layers without removing the exposed portions of the resist and PID layers.

34. The method of claim 27, wherein each of the plurality of dual-damascene ZMVs has substantially a same size as the trace.

35. The method of claim 34, wherein the one or more metal pads has substantially a same size as the plurality of dual-damascene ZMVs or the trace.

36. The method of claim 27, wherein top sides of the one or more metal pads are co-planar with a top side of the buildup film.

* * * * *